(12) United States Patent
Jeon et al.

(10) Patent No.: US 9,275,746 B2
(45) Date of Patent: Mar. 1, 2016

(54) SOURCE LINE FLOATING CIRCUITS, MEMORY DEVICES INCLUDING THE SAME AND METHODS OF READING DATA IN A MEMORY DEVICE

(71) Applicants: Chang-Min Jeon, Yongin-si (KR); Bo-Young Seo, Suwon-si (KR); Tea-Kwang Yu, Hwasung-si (KR)

(72) Inventors: Chang-Min Jeon, Yongin-si (KR); Bo-Young Seo, Suwon-si (KR); Tea-Kwang Yu, Hwasung-si (KR)

(73) Assignee: Samsung Electronics Co., Ltd. (KR)

( * ) Notice: Subject to any disclaimer, the term of this patent is extended or adjusted under 35 U.S.C. 154(b) by 77 days.

(21) Appl. No.: 14/208,200

(22) Filed: Mar. 13, 2014

(65) Prior Publication Data

US 2014/0269064 A1 Sep. 18, 2014

(30) Foreign Application Priority Data

Mar. 13, 2013 (KR) ........................ 10-2013-0026945

(51) Int. Cl.
*G11C 11/00* (2006.01)
*G11C 11/14* (2006.01)
*G11C 11/15* (2006.01)
*G11C 16/24* (2006.01)
*G11C 16/26* (2006.01)
*G11C 16/08* (2006.01)
*G11C 11/16* (2006.01)
*G11C 13/00* (2006.01)

(52) U.S. Cl.
CPC ................ *G11C 16/24* (2013.01); *G11C 11/16* (2013.01); *G11C 11/1673* (2013.01); *G11C 13/0002* (2013.01); *G11C 13/0004* (2013.01); *G11C 13/004* (2013.01); *G11C 13/0007* (2013.01); *G11C 16/08* (2013.01); *G11C 16/26* (2013.01); *G11C 2213/79* (2013.01); *G11C 2213/82* (2013.01)

(58) Field of Classification Search
USPC .......................... 365/148, 158, 163, 171, 173
See application file for complete search history.

(56) References Cited

U.S. PATENT DOCUMENTS

| | | | |
|---|---|---|---|
| 7,038,947 B2 | 5/2006 | Chih | |
| 7,864,576 B2 | 1/2011 | Iioka | |
| 7,944,759 B2 | 5/2011 | Kim et al. | |
| 8,014,198 B2 | 9/2011 | Torii | |
| 8,064,247 B2 * | 11/2011 | Lee et al. | ....................... 365/163 |
| 8,089,808 B2 | 1/2012 | Torii | |
| 8,120,959 B2 | 2/2012 | Lee et al. | |
| 8,138,524 B2 | 3/2012 | Kotov et al. | |
| 8,331,127 B2 * | 12/2012 | Chen et al. | ..................... 365/148 |

(Continued)

FOREIGN PATENT DOCUMENTS

| | | |
|---|---|---|
| JP | 2004-326929 A | 11/2004 |
| KR | 10-1043980 B1 | 6/2011 |

OTHER PUBLICATIONS

Tiburzi et al. Patent Application Publication US 2013/0272053.*

*Primary Examiner* — Trong Phan
(74) *Attorney, Agent, or Firm* — Myers Bigel Sibley & Sajovec, P.A.

(57) ABSTRACT

A source line floating circuit includes a plurality of floating units. The floating units directly receive decoded row address signals or voltages of word lines as floating control signals, respectively. The decoded row address signals are activated selectively in response to a row address signal. The floating units control electrical connections between source lines and a source voltage in response to the floating control signals in a read operation. Related devices and methods are also described.

28 Claims, 25 Drawing Sheets

(56) References Cited

U.S. PATENT DOCUMENTS

| | | | |
|---|---|---|---|
| 8,363,451 B2 * | 1/2013 | Rao | 365/148 |
| 8,582,347 B2 * | 11/2013 | Jung et al. | 365/148 |
| 8,587,987 B2 * | 11/2013 | Aoki | 365/148 |
| 8,634,227 B2 * | 1/2014 | Yu et al. | 365/148 |
| 8,675,384 B2 * | 3/2014 | Kuo et al. | 365/148 |

* cited by examiner

SOURCE LINE FLOATING CIRCUITS, MEMORY DEVICES INCLUDING THE SAME AND METHODS OF READING DATA IN A MEMORY DEVICE

CROSS-REFERENCE TO RELATED APPLICATION

This U.S. non-provisional application claims priority under 35 USC §119 to Korean Patent Application No. 10-2013-0026945, filed on Mar. 13, 2013, the entirety of which is incorporated by reference herein.

BACKGROUND

Example embodiments relate generally to semiconductor integrated circuits, and more particularly to memory devices and circuits, and methods of reading data in memory devices.

Semiconductor memory devices include a plurality of memory cells that are arranged in a matrix form of a plurality of rows and a plurality of columns. In a non-volatile memory device, the memory cells are coupled between a plurality of source lines and a plurality of bit lines. Each bit line is coupled to the memory cells that are selected by the respective word lines. In a read operation, one memory cell is selected among the memory cells commonly coupled to the same bit line, and a sensing current flows from the bit line to the source line via the selected memory cell where the sensing current depends on the state, that is, the stored data of the selected memory cell. The stored data may be read out based on the sensing current or a voltage change due to the sensing current. In such read operation, the bit line voltage may be affected by leakage currents by the unselected memory cells coupled to the same bit line, and thus reliability of the read operation or the read data may be degraded.

SUMMARY

At least one example embodiment of the inventive concepts provides a source line floating circuit that can enhance reliability of a read operation by reducing leakage currents due to unselected memory cells.

At least one example embodiment of the inventive concepts provides a memory device that can enhance reliability of a read operation using the source line floating circuit.

At least one example embodiment of the inventive concepts provides a method of reading data in a memory device that can enhance reliability of read data by reducing leakage currents due to unselected memory cells.

According to example embodiments, a memory device includes a memory cell array, a row selection circuit and a source line floating circuit.

The memory cell array includes a plurality of memory cells arranged in a matrix form of a plurality of rows and columns. The memory cells are coupled between a plurality of source lines extended in a row direction and a plurality of bit lines extended in a column direction. The memory cells are selected row by row by a plurality of word lines extended in the row direction.

The row selection circuit generates a plurality of decoded row address signals that are activated selectively in response to a row address signal, and enables one selected word line among the word lines in response to the decoded row address signals.

The source line floating circuit, in a read operation, connects one selected source line of the source lines to a source voltage and is configured to disconnect unselected source lines except the one selected source line from the source voltage to float the unselected source lines, where the one selected source line is coupled to the memory cells that are coupled to the one selected word line.

The source line floating circuit may include a plurality of floating units that directly receive the decoded row address signals or voltages of the word lines as floating control signals, respectively, and the floating units may control electrical connections between the source lines and the source voltage in response to the floating control signals.

Each of the source lines may be coupled to the memory cells of one row.

Each of the floating units may include a switching element coupled between the corresponding source line and the source voltage, and the switching element may perform a switching operation in response to the floating control signal corresponding to the one row.

Each of the source lines may be coupled commonly to the memory cells of one even-numbered row and the memory cells of one odd-numbered row adjacent to the even-numbered row.

Each of the floating units may include an OR gate and a switching element. The OR gate may perform an OR logic operation on the two floating control signals corresponding to the even-numbered row and the odd-numbered row. The switching element may be coupled between the corresponding source line and the source voltage, and the switching element may perform a switching operation in response to an output of the OR gate.

The memory device may further include a plurality of source line driving units configured to apply a high voltage to the source lines depending on operational modes. Each of the source line driving units may include a pull-down transistor and a pull-down transistor. The pull-down transistor may be coupled between the source voltage and the corresponding source line, and a gate of the pull-down transistor may receive a driving signal. The pull-up transistor may be coupled between the high voltage and the corresponding source line, and a gate of the pull-up transistor may receive an inverted driving signal.

Each of the floating units may include a switching element coupled in series with the pull-down transistor between the corresponding source line and the source voltage.

The pull-up transistor and the pull-down transistor may be implemented with high-voltage transistors having relatively a higher withstand voltage, and the switching element may be implemented with a low-voltage transistor having relatively a lower withstand voltage.

Each of the source lines may be coupled to the memory cells of one row, and the switching element may be implemented with a low-voltage transistor that is turned on in response to the floating control signal corresponding to the one row.

Each of the source lines may be coupled commonly to the memory cells of one even-numbered row and the memory cells of one odd-numbered row adjacent to the even-numbered row. Each of the floating units may further include an OR gate configured to perform an OR logic operation on the two floating control signals corresponding to the even-numbered row and the odd-numbered row, and the switching element may be implemented with a low-voltage transistor that is turned on in response to an output of the OR gate.

Each of the memory cells may include a flash cell transistor coupled between the corresponding bit line and the corresponding source line, and a control gate of the flash cell transistor may be coupled to the corresponding word line.

Each of the memory cells may include a switching transistor and a flash cell transistor. The switching transistor may be coupled between the corresponding bit line and the corresponding source line, and a gate of the switching transistor may be coupled to the corresponding word line. The flash cell transistor may be coupled in series with the switching transistor between the corresponding bit line and the corresponding source line, and a control gate of the flash cell transistor may be coupled to a corresponding control line of a plurality of control lines.

In the read operation, a read voltage may be applied to all of the control lines, a word line enable voltage may be applied to the one selected word line and a word line disable voltage may be applied to the unselected word lines. The word line enable voltage may be lower than the read voltage, and the word line disable voltage may be lower than the word line enable voltage.

Each of the memory cells may include a switching transistor and a resistive element. The switching transistor may be coupled between the corresponding bit line and the corresponding source line, and a gate of the switching transistor may be coupled to the corresponding word line. The resistive element may be coupled in series with the switching transistor between the corresponding bit line and the corresponding source line.

The memory cell array may include phase change random access memory (PRAM) cells, resistance random access memory (RRAM) cells or magneto-resistive random access memory (MRAM) cells.

The memory cell array may include spin transfer torque magneto-resistive random access memory (STT-MRAM) cells.

The memory device may be an embedded non-volatile memory device that is integrated with at least one processor in a single chip.

According to example embodiments, a method of reading data in a memory device is provided. The memory device includes a memory cell array in which a plurality of memory cells are arranged in a matrix form of a plurality of rows and columns, the memory cells are coupled between a plurality of source lines extended in a row direction and a plurality of bit lines extended in a column direction, and the memory cells are configured to be selected row by row by a plurality of word lines extended in the row direction. The method includes generating a plurality of decoded row address signals that are activated selectively in response to a row address signal; enabling one selected word line among the word lines in response to the decoded row address signals; receiving the decoded row address signals or voltages of the word lines as floating control signals; and in response to the floating control signals in a read operation, connecting one selected source line of the source lines to a source voltage and disconnecting unselected source lines except the one selected source line from the source voltage to float the unselected source lines, the one selected source line coupled to the memory cells that are coupled to the one selected word line.

Each of the source lines may be coupled to the memory cells of one row, and each of the source lines may be floated in response to one floating control signal of the floating control signals in the read operation.

Each of the source lines may be coupled commonly to the memory cells of one even-numbered row and the memory cells of one odd-numbered row adjacent to the even-numbered row, and each of the source lines may be floated in response to two floating control signals of the floating control signals in the read operation.

The method may further includes applying a high voltage to the source lines depending on operational modes, using a plurality of source line driving units coupled between the high voltage and the source voltage. Each of the source line driving units may be connected to or disconnected from the source voltage in response to the corresponding floating control signal.

The memory device may be a non-volatile memory device including flash memory cells, phase change random access memory (PRMA) cells, resistance random access memory (RRAM) cells or magneto-resistive random access memory (MRAM) cells.

According to example embodiments, a source line floating circuit is provided, which is included in a memory device including a memory cell array in which a plurality of memory cells are arranged in a matrix form of a plurality of rows and columns, the memory cells coupled between a plurality of source lines extended in a row direction and a plurality of bit lines extended in a column direction, the memory cells configured to be selected row by row by a plurality of word lines extended in the row direction. The source line floating circuit includes a plurality of floating units that directly receive decoded row address signals or voltages of the word lines as floating control signals, respectively, the decoded row address signals being activated selectively in response to a row address signal, the floating units configured to control electrical connections between the source lines and the source voltage in response to the floating control signals in a read operation.

Each of the floating units may be coupled directly between the source voltage and the corresponding source line.

Each of the floating units may be coupled directly between the source voltage and a source line driving unit configured to drive the corresponding source line.

BRIEF DESCRIPTION OF THE DRAWINGS

Example embodiments of the inventive concepts will be more clearly understood from the following detailed description taken in conjunction with the accompanying drawings.

DETAILED DESCRIPTION OF THE EMBODIMENTS

Figure 1:
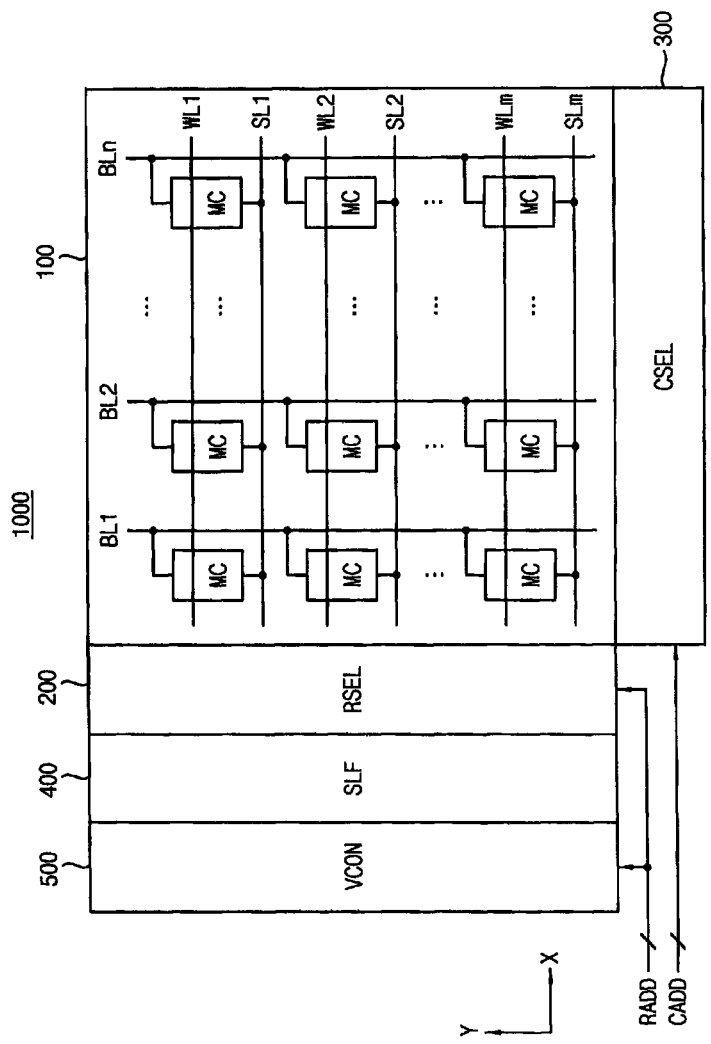
FIG. 1 is a block diagram illustrating a memory device according to example embodiments of the inventive concepts.

Various example embodiments will be described more fully hereinafter with reference to the accompanying drawings, in which some example embodiments are shown. The present inventive concepts may, however, be embodied in many different forms and should not be construed as limited to the example embodiments set forth herein. Rather, these example embodiments are provided so that this disclosure will be thorough and complete, and will fully convey the scope of the present inventive concepts to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a memory device according to example embodiments of the inventive concepts.

Referring to FIG. 1, a memory device 1000 may include a memory cell array 100, a row selection circuit (RSEL) 200, a column selection circuit (CSEL) 300, a source line floating circuit (SLF) 400 and a voltage control circuit (VCON) 500.

The memory cell array 100 includes a plurality of memory cells MCs arranged in a matrix form of a plurality of rows and columns. The memory cells MCs are coupled between a plurality of source lines SL1~SLm extended in a row direction X and a plurality of bit lines BL1~BLn extended in a column direction Y. The memory cells MCs are selected row by row by a plurality of word lines WL1~WLm extended in the row direction X.

The row selection circuit 200 generates a plurality of decoded row address signals that are activated selectively in response to a row address signal RADD, and enables one selected word line among the word lines WL1~WLm in response to the decoded row address signals. As described with reference to FIGS. 2 and 3, the row selection circuit 200 may include a row decoder, a word line driving circuits, etc.

In a read operation, the source line floating circuit 400 connects one selected source line of the source lines SL1~SLm to a source voltage and disconnects unselected source lines except the one selected source line from the source voltage to float the unselected source lines, where the one selected source line is coupled to the memory cells that are coupled to the one selected word line. Hereinafter, the source voltage is assumed to be a ground voltage, but the source voltage may be determined variously depending on the configuration of the memory device 1000. The source line floating circuit 400 may enhance reliability of the read operation by reducing the leakage current through such selective floating of the source lines.

The column selection circuit 300 selects one of the bit lines BL1~BLn in response to a column address signal CADD. The column selection circuit 300 may include a column decoder, a gating circuit, etc.

Figure 22:
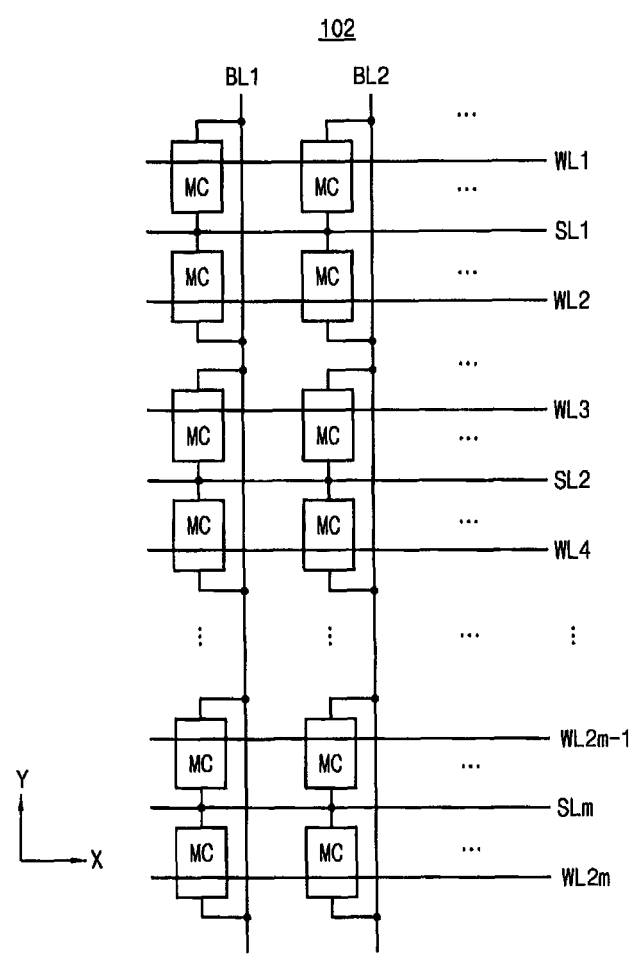
FIG. 22 is a diagram illustrating an example of a memory cell array in the memory device of FIG. 1.

FIG. 1 illustrates a non-limiting configuration of the memory cell array 100 in which one source line is coupled to the memory cells MCs corresponding to one row for convenience of illustration, and the selective floating of the inventive concepts is not limited to the configuration of FIG. 1. For example, the source line floating circuit may be applied to a configuration in which each of the source lines is coupled commonly to the memory cells of one even-numbered row and the memory cells of one odd-numbered row adjacent to the even-numbered row as illustrated in FIG. 22.

Figure 20:
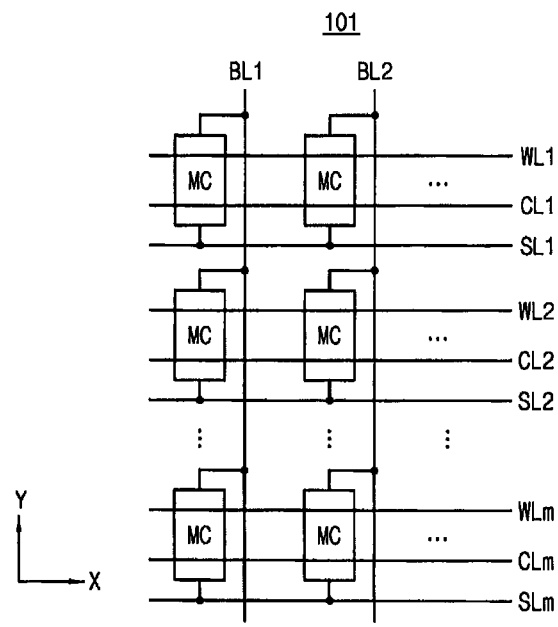
FIG. 20 is a diagram illustrating an example of a memory cell array in the memory device of FIG. 1.
Figure 30:
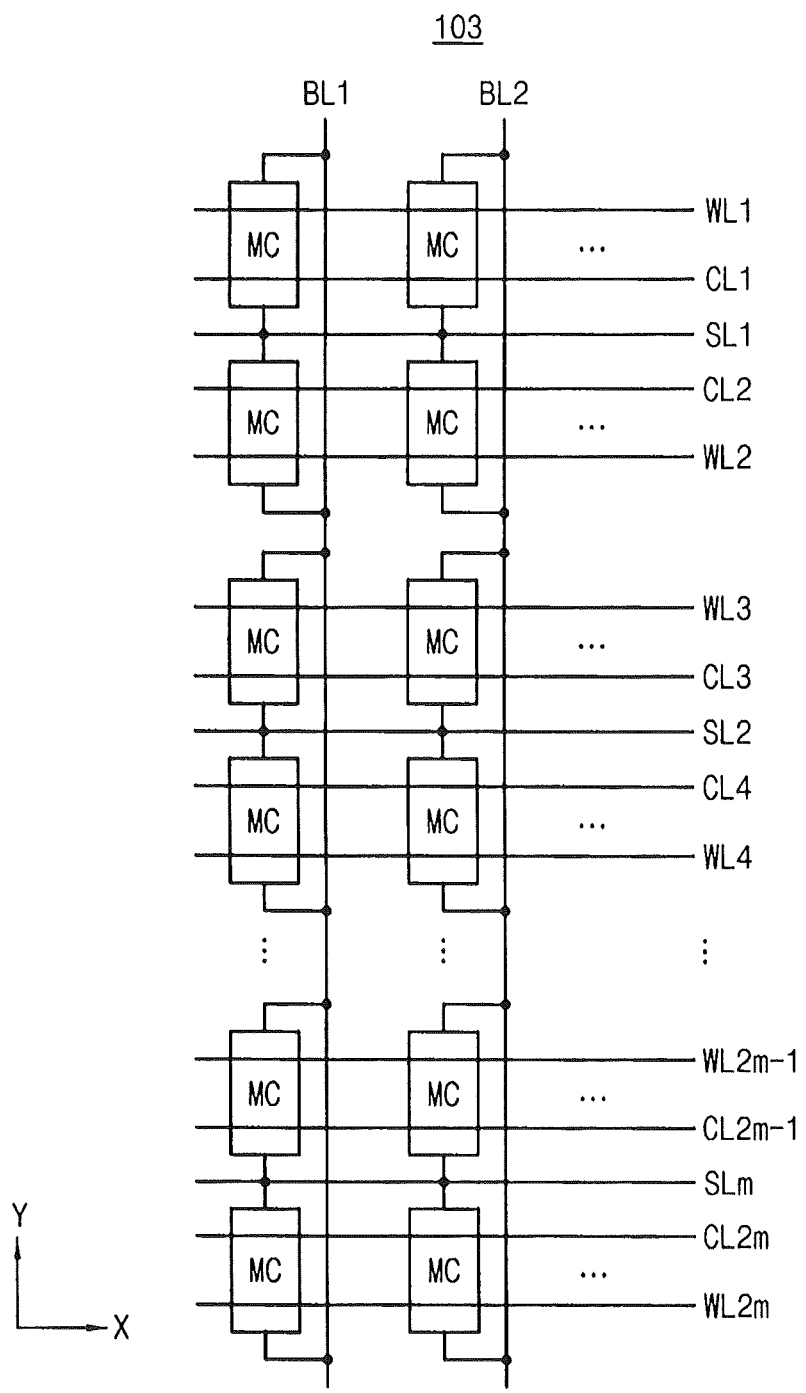
FIG. 30 is a diagram illustrating an example of a memory cell array in the memory device of FIG. 1.
Figure 32:
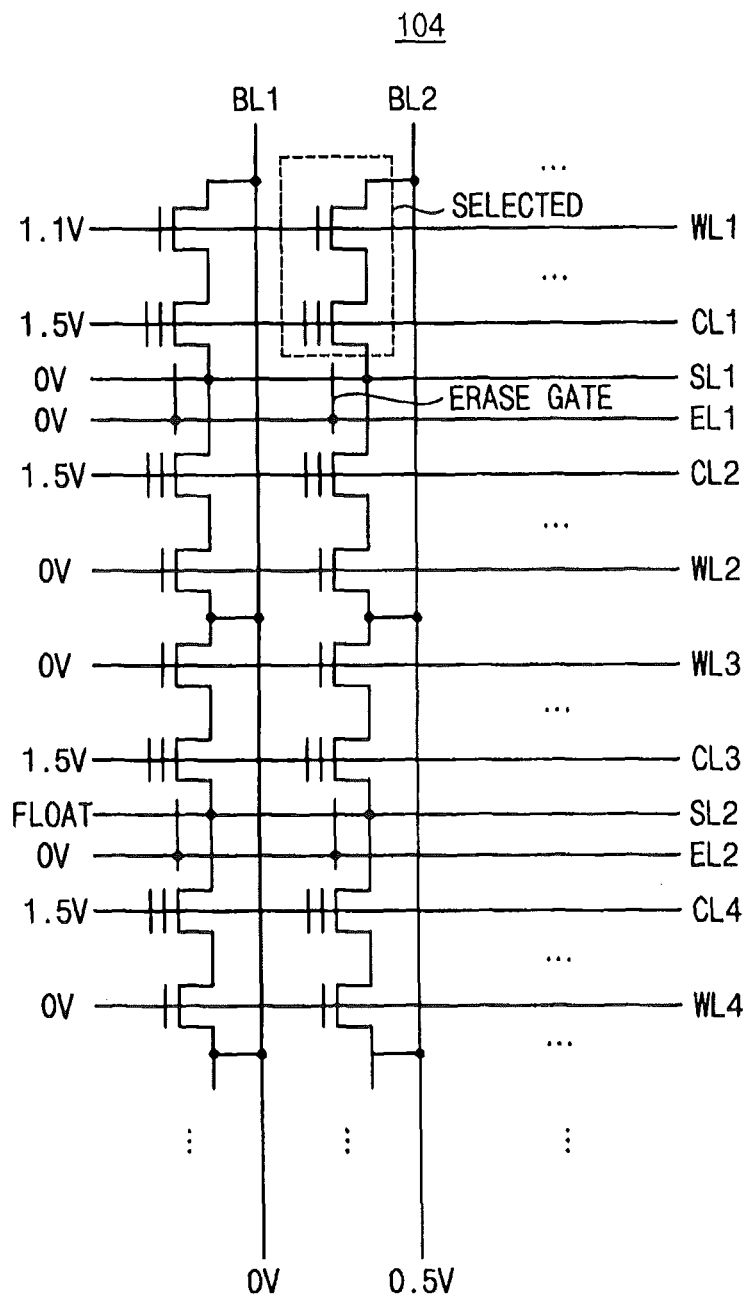
FIG. 32 is a diagram for describing a read operation in a memory device according to an example embodiment of the inventive concepts.

In some example embodiments, the memory cells may be further coupled to a plurality of control lines extended in the row direction as illustrated in FIGS. 20 and 30. Furthermore, the memory cells may be further coupled to a plurality of erase lines extended in the row direction as illustrated in FIG. 32.

Figure 26:
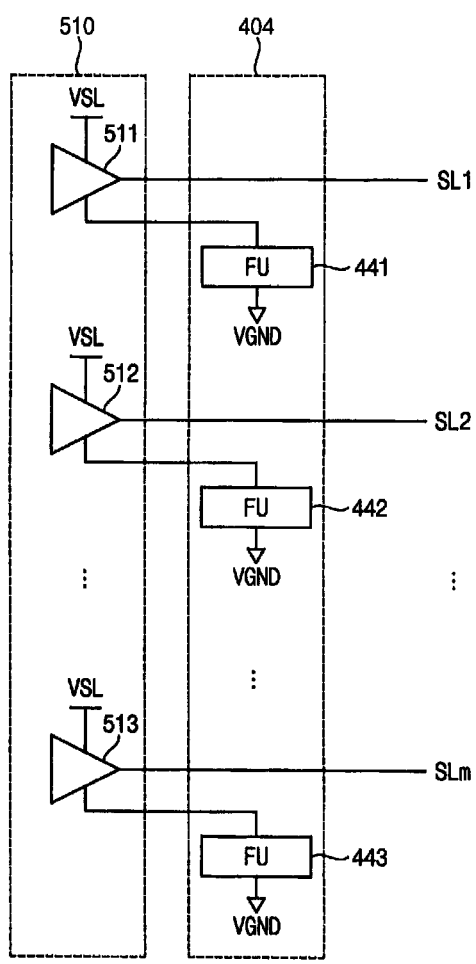
FIG. 26 is a diagram illustrating a source line driving circuit and a source line floating circuit according to an example embodiment of the inventive concepts.
Figure 29:
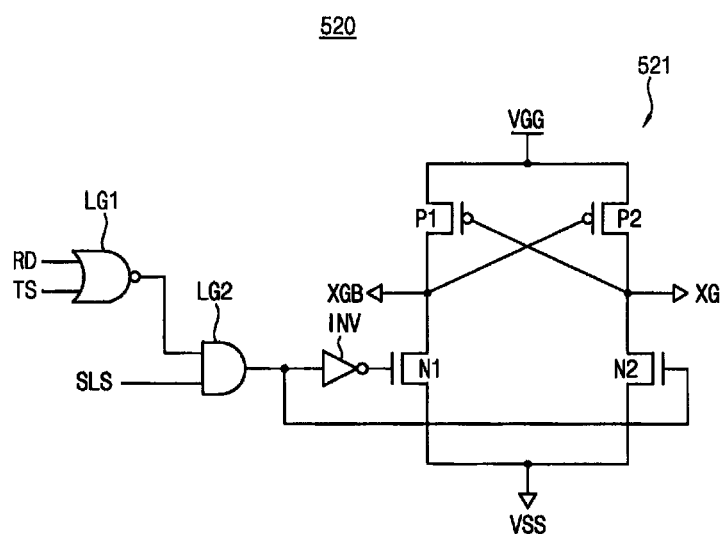
FIG. 29 is a circuit diagram illustrating an example of a circuit for generating a driving signal provided to a source line driving circuit.

The voltage control circuit 500 may be configured to provide various voltages according to operational modes such as a read operation, a write operation, an erase operation, etc. Particularly the voltage control circuit 500 may include a source line driving circuit 510 as illustrated in FIG. 26 and a driving signal generation circuit 520 as illustrated in FIG. 29.

Figure 2:
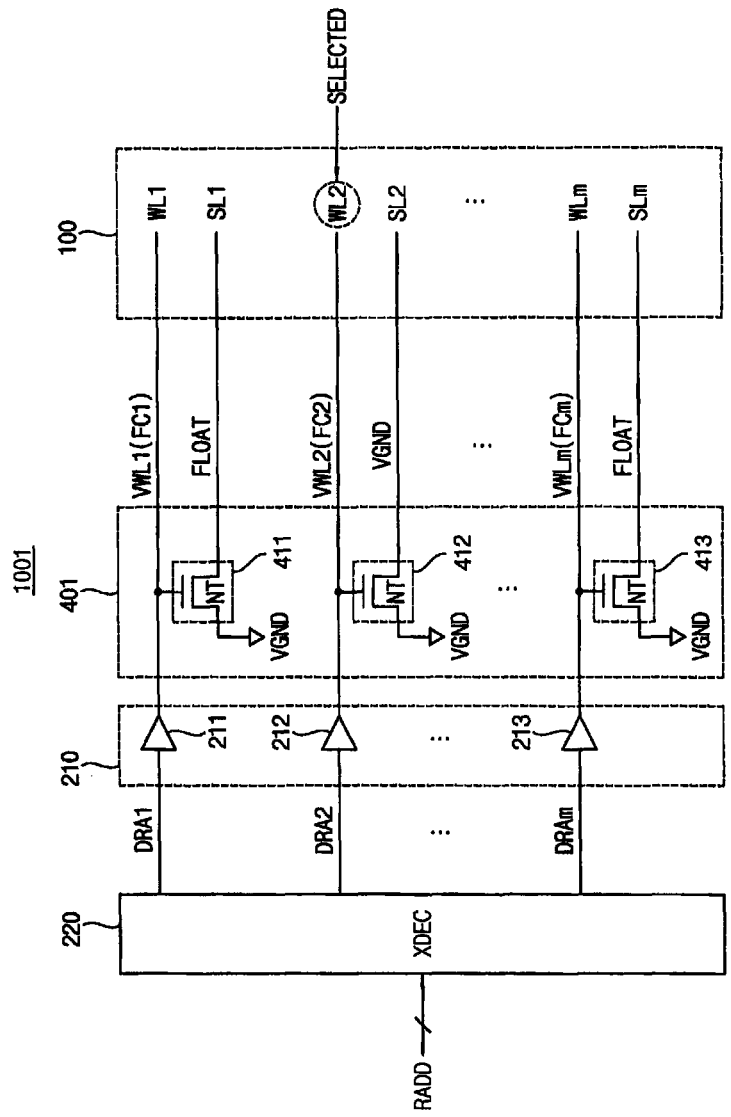
FIG. 2 is a circuit diagram illustrating a memory device including a source line floating circuit according to an example embodiment of the inventive concepts.

FIG. 2 is a circuit diagram illustrating a memory device including a source line floating circuit according to an example embodiment of the inventive concepts.

Referring to FIG. 2, a memory device 1001 may include a word line driving circuit 210, a row decoder (XDEC) 220, a source line floating circuit 401 and a memory cell array 100. The word line driving circuit 210 and the row decoder 220 may be included in the row selection circuit 200 in FIG. 1. Some components of FIG. 1 are omitted in FIG. 2 and the repeated descriptions may be omitted.

The row decoder 220 may generate a plurality of decoded row address signals DRA1~DRAm based on a row address signal RADD such that only one decoded row address signal corresponding to the row address signal RADD may be activated selectively. The word line driving circuit 210 may enable one selected word line among the word lines WL1, WL2 and WLm in response to the decoded row address signals DRA1, DRA2 and DRAm. The word line driving circuit 210 may include a plurality of driving units 211, 212 and 213 and each of the driving units 211, 212 and 213 may drive each word line in response to each of the decoded row address signals DRA1, DRA2 and DRAm.

The source line floating circuit 401 may include a plurality of floating units 411, 412 and 413 corresponding to the number of the source lines SL1, SL2 and SLm. The floating units 411, 412 and 413 may directly receive voltages VWL1, VWL2 and VWLm of the word lines WL1, WL2 and WLm as floating control signals FC1, FC2 and FCm to control the electrical connections between the source lines SL1, SL2 and SLm and the source voltage such as a ground voltage VGND.

When each of the source lines SL1, SL2 and SLm is coupled to the memory cells of one row as illustrated in FIGS. 1 and 2, each of the floating units 411, 412 and 413 may include a switching element NT coupled between the corresponding source line and the source voltage VGND. For example, the switch element may be implemented with an N-type metal-oxide semiconductor (NMOS) transistor. The switching element NT performs a switching operation in response to the floating control signal FC1, FC2 or FCm corresponding to the one row.

For example, when the row address signal RADD corresponds to the second word line WL2, only the second decoded row address signal DRA2 is activated in a logic high level and the other decoded row address signals DRA1 and DRAm are deactivated in a logic low level. Among the driving units 211, 212 and 213 in the word line driving circuit 210, only the second driving unit 212 outputs a word line enable voltage (e.g., 1.1 V) in response to the activated second decoded row address signal DRA2 and the other driving units 211 and 213 output a word line disable voltage (e.g., 0 V) in response to the deactivated decoded row address signals DRA1 and DRAm. Accordingly only the switching element NT in the second floating unit 412 is turned on to connect the second source line SL2 to the source voltage VGND, and the other source lines SL1 and SLm are disconnected from the source voltage VGND to be floated.

Figure 3:
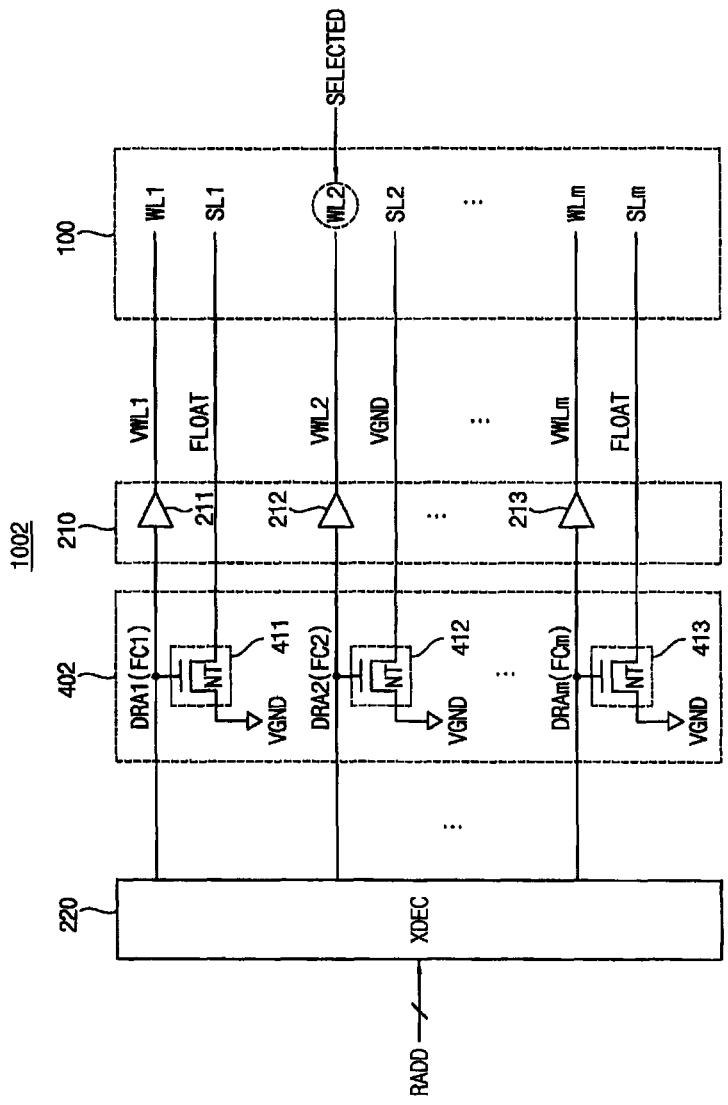
FIG. 3 is a circuit diagram illustrating a memory device including a source line floating circuit according to another example embodiment of the inventive concepts.

FIG. 3 is a circuit diagram illustrating a memory device including a source line floating circuit according to another example embodiment of the inventive concepts.

Referring to FIG. 3, a memory device 1002 may include a word line driving circuit 210, a row decoder (XDEC) 220, a source line floating circuit 402 and a memory cell array 100. The memory device 1002 of FIG. 3 is similar to the memory device 1001 of FIG. 2 except the source line floating circuit 402, and the repeated descriptions may be omitted.

The source line floating circuit 402 may include a plurality of floating units 411, 412 and 413 corresponding to the number of the source lines SL1, SL2 and SLm. The floating units 411, 412 and 413 may directly receive the decoded row address signals DRA1, DRA2 and DRAm as the floating control signals FC1, FC2 and FCm to control the electrical connections between the source lines SL1, SL2 and SLm and the source voltage VGND.

When each of the source lines SL1, SL2 and SLm is coupled to the memory cells of one row as illustrated in FIGS. 1 and 3, each of the floating units 411, 412 and 413 may include a switching element NT coupled between the corresponding source line and the source voltage VGND. For example, the switch element may be implemented with an NMOS transistor. The switching element NT performs a switching operation in response to the floating control signal FC1, FC2 or FCm corresponding to the one row.

For example, when the row address signal RADD corresponds to the second word line WL2, only the second decoded row address signal DRA2 is activated in a logic high level and the other decoded row address signals DRA1 and DRAm are deactivated in a logic low level. Accordingly only the switching element NT in the second floating unit 412 is turned on to connect the second source line SL2 to the source voltage VGND, and the other source lines SL1 and SLm are disconnected from the source voltage VGND to be floated.

As described with reference to FIGS. 2 and 3, the source line floating circuits 401 and 402 according to example embodiments of the inventive concepts may directly receive the decoded row address signals DRA1~DRAm or the word line voltage VWL1~VWLm as the floating control signals FC1~FCm. The source line floating circuits 401 and 402 may control the electrical connections of the source lines SL1~SLm to the source voltage VGND, respectively, in response to the floating control signals FC1-FCm. The reliability of the read operation may be enhanced by such selective floating of the source lines to reduce the leakage current through the unselected memory cells.

The generation of the decoded row address signals DRA1~DRAm and the selective enabling of the word lines WL1~WLm based on the decoded row address signals DRA1~DRAm are required inevitably to perform the read operation. The source line floating circuits 401 and 402 may perform the selective floating of the source lines SL1~SLm without additional decoding process, and thus the reliability of the read operation may be enhanced without degrading the read speed.

Figure 4:
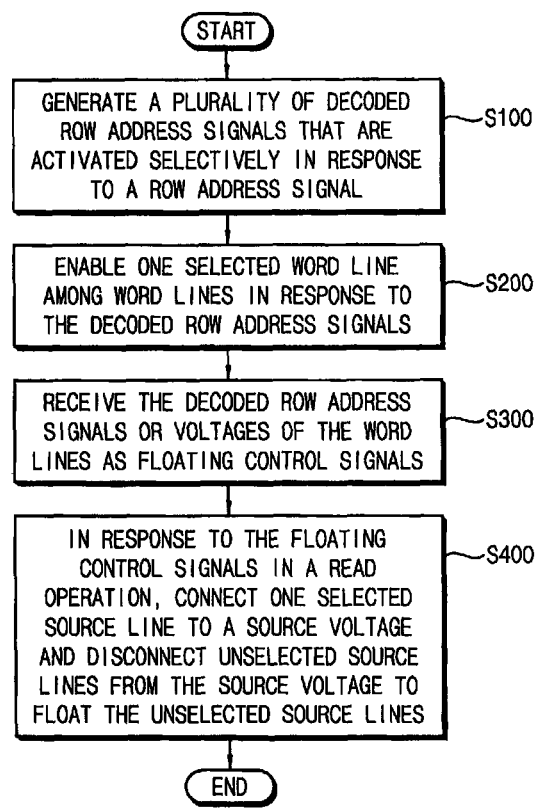
FIG. 4 is a flow chart illustrating a memory of reading data in a memory device according to example embodiments of the inventive concepts.

FIG. 4 is a flow chart illustrating a memory of reading data in a memory device according to example embodiments of the inventive concepts.

Referring to FIGS. 1 through 4, the row decoder 220 in the row selection circuit 200 may generate a plurality of decoded row address signals DRA1, DRA2 and DRAm that are activated selectively in response to a row address signal RADD (S100). The number of the decoded row address signals DRA1, DRA2 and DRAm may correspond to the number of the word lines WL1, WL2 and WLm. Among the decoded row address signals DRA1, DRA2 and DRAm, one decoded row address signal corresponding to the row address signal RADD may be activated in a first logic level (e.g., the logic high level) and the other decoded row address signals may be deactivated in a second logic level (e.g., the logic low level).

The word line driving circuit 210 may enable one selected word line among the word lines WL1, WL2 and WLm in response to the decoded row address signals DRA1~DRAm (S200). The word line driving circuit 210 may include a plurality of driving units 211, 212 and 213 and each of the driving units 211, 212 and 213 may drive each word line in response to each of the decoded row address signals DRA1, DRA2 and DRAm. Among the driving units 211, 212 and 213 in the word line driving circuit 210, The word line enable voltage (e.g., 1.1 V) may be applied to the one selected word line corresponding to the activated decoded row address signal and the word line disable voltage (e.g., 0 V) may be applied to the other word lines.

The source line floating circuit 400 may receive the decoded row address signals DRA1, DRA2 and DRAm or the word line voltages VWL1, VWL2 and VWLm as the floating control signals FC1, FC2 and FCm (S300). The source line floating circuit 401 may receive the decoded row address signals DRA1, DRA2 as the floating control signals FC1, FC2 and FCm as illustrated in FIG. 2, or the source line floating circuit 402 may receive the word line voltages VWL1, VWL2 and VWLm as the floating control signals FC1, FC2 and FCm as illustrated in FIG. 3.

In response to the floating control signals FC1, FC2 and FCm in the read operation, the source line floating circuit 400 may connect one selected source line of the source lines SL1, SL2 and SL3 to the source voltage VGND and disconnect unselected source lines except the one selected source line from the source voltage VGND to float the unselected source lines (S400). For example, the source voltage VGND may have a level of 0 V, or a predetermined level other than 0 V.

As such, the leakage current through the unselected memory cells, which are coupled to the unselected source lines, may be reduced by floating the unselected source lines.

Figure 5:
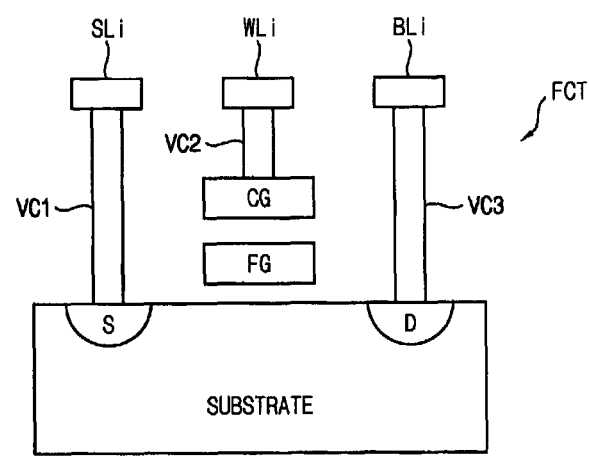
FIGS. 5 and 6 are diagrams illustrating an example of a flash memory cell included in a memory cell array in FIG. 1.
Figure 6:
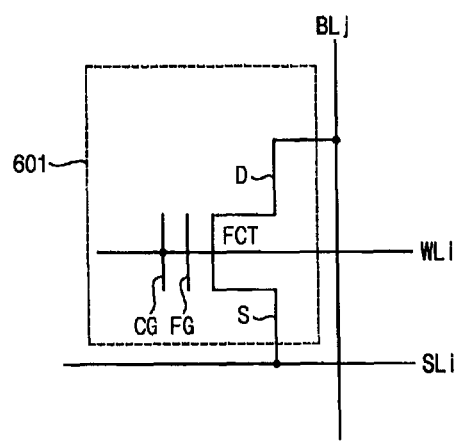

FIGS. 5 and 6 are diagrams illustrating an example of a flash memory cell included in a memory cell array in FIG. 1.

Each memory cell MC in the memory cell array 100 in FIG. 1 may be a flash memory cell 601 as illustrated in FIGS. 5 and 6. The flash memory cell 601 may include a flash cell transistor FCT coupled between the corresponding bit line BLj and the corresponding source line SLi. The gate CG of the flash cell transistor FCT may be coupled to the corresponding word line WLi. FIG. 5 illustrates a cross-sectional view of an example structure of the flash cell transistor FCT and FIG. 6 illustrates an equivalent circuit of the flash cell transistor FCT.

To form the flash cell transistor FCT, a source region S and a drain region D may be formed in an upper portion of a semiconductor substrate, and a floating gate FG and a control gate CG may be stacked on the substrate between the source region S and the drain region D. The dielectric layer such as oxide/nitride/oxide (ONO) layer may be formed between the floating gate FG and the control gate CG, and the tunneling oxide layer may be formed between the floating gate CG and the upper surface of the substrate. The source region S, the control gate CG and the drain region D may be electrically connected to the source line SLi, the word line WLi and the bit line BLj using the vertical contacts VC1, VC2 and VC3, respectively. The bit line (BLj) extended in the column direction may be formed in the different metal layer from the source line SLi and the word line WLi extended in the row direction. The read operation, the write operation and the erase operation of the flash memory cell 601 may be performed by controlling the voltages applied to the source line SLi, the word line WLi and the bit line BLj.

Figure 7:
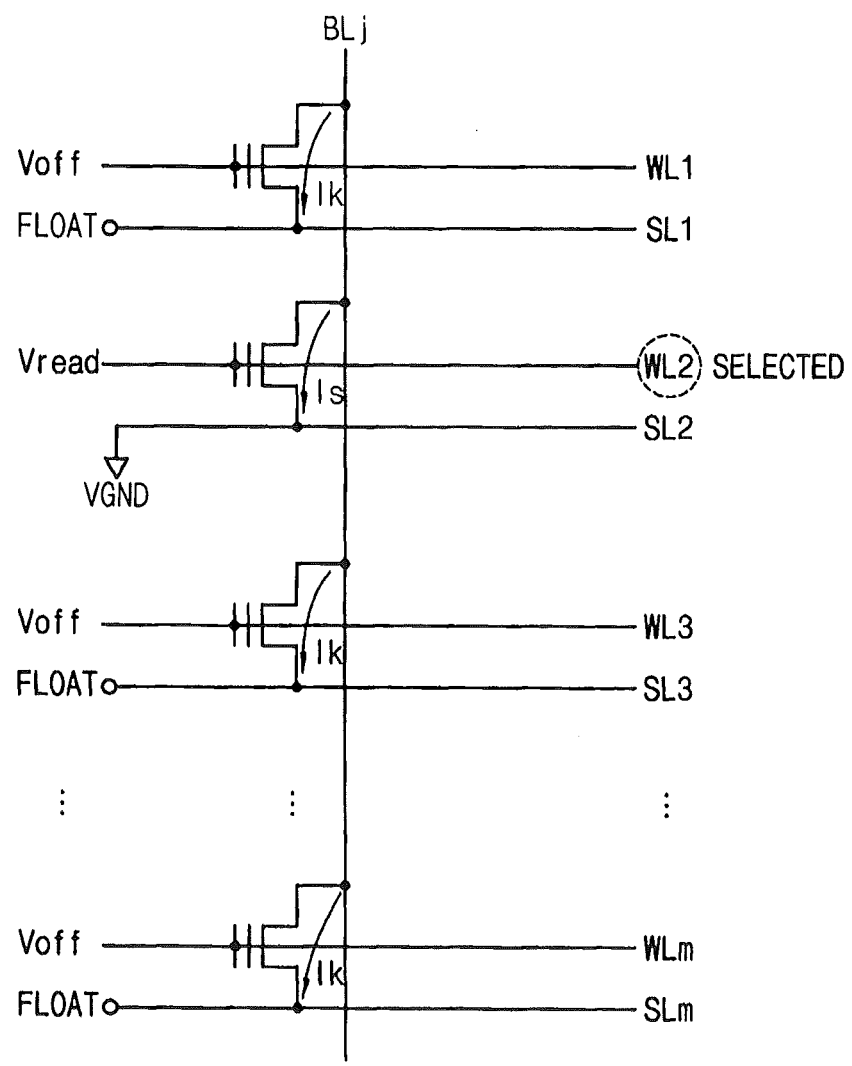
FIGS. 7 and 8 are diagrams for describing reduction of a leakage current according to example embodiments of the inventive concepts.
Figure 8:
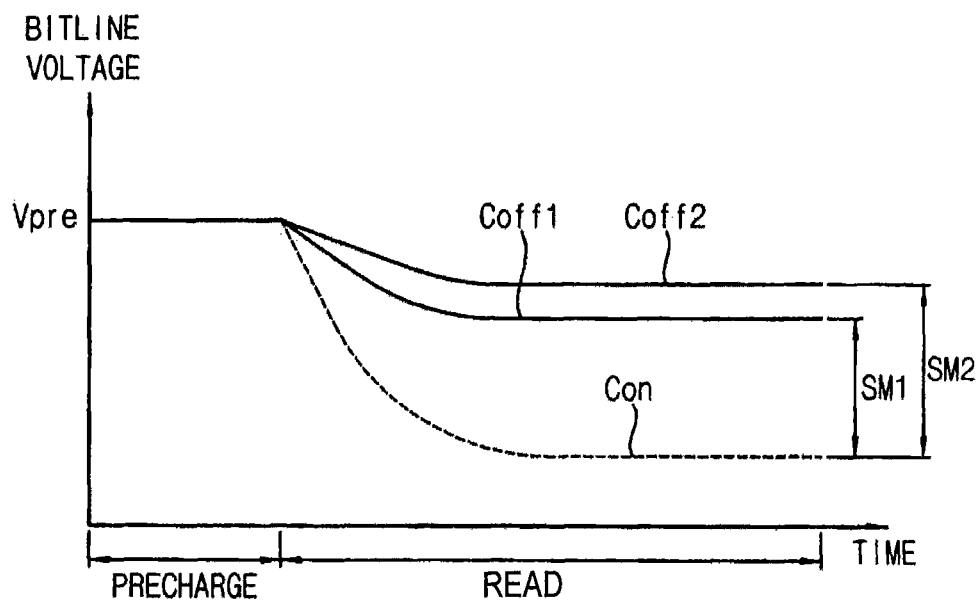

FIGS. 7 and 8 are diagrams for describing reduction of a leakage current according to example embodiments of the inventive concepts.

Referring to FIGS. 7 and 8, the bit line BLj is precharged with a precharge voltage Vpre. In case of a page open operation, the read operation may be performed simultaneously with respect to a plurality of bit lines. After the bit line BLj is precharged, a read voltage Vread is applied to the selected word line WL2 and an off voltage Voff is applied to the unselected word lines WL1, WL3 and WLm. The read voltage Vread has a voltage level so that the On-cell having relatively a higher threshold voltage may be turned on and the off-cell having relatively a lower threshold voltage may be turned off. The off voltage Voff has a voltage level so that both of the on-cell and the off-cell may be turned off.

The leakage currents Ik may flow through the unselected memory cells even though the off voltage Voff is applied to the unselected word lines WL1, WL3 and WLm to turn off the unselected memory cells. The large number of memory cells are coupled to the one bit line BLj and thus the sum of the leakage currents Ik may be increased to a few IAA (micro Ampere) even if each leakage current Ik thorough one memory cell is small enough to a few nA (nano Ampere). The leakage current increases as the operational temperature increases, and thus the reliability of determination whether the selected memory cell is the on-cell or the off-cell, that is, the reliability of the read data may be degraded particularly in the high temperature.

FIG. 8 illustrates a first bit line voltage Con when the selected memory cell is the on-cell, a second bit line voltage Coff1 when the selected memory cell is the off-cell and all of the source lines SL1, SL2, SL3 and SLm are connected to the source voltage, and a third bit line voltage Coff2 when the selected memory cell is the off-cell and only the selected source line SL2 is connected to the source voltage while the unselected source lines SL1, SL3 and SLm are floated according to example embodiments of the inventive concepts. As show in FIG. 8, the read sensing margin SM2 may be increased compared with the conventional read sensing margin SM1 by reducing the leakage current Ik through the selective floating of the source lines.

Figure 9:
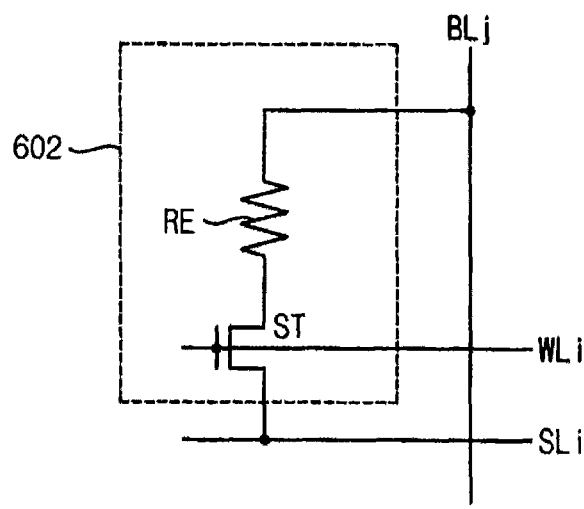
FIG. 9 is a diagram illustrating an example of a resistive memory cell included in a memory cell array in FIG. 1.

FIG. 9 is a diagram illustrating an example of a resistive memory cell included in a memory cell array in FIG. 1.

Referring to FIG. 9, a resistive memory cell 602 may include a resistive element RE and a switching transistor ST, which are serially coupled between a corresponding bit line BLj and a corresponding source line SLi. A gate of the switching transistor ST is coupled to a corresponding word line WLi.

The resistive memory cell 602 of FIG. 9 may determine a resistance distribution of the resistive element RE by controlling voltages applied to the bit line BLj and the source line SLi. The configuration of the resistive memory cell 602 of FIG. 9 may be adopted when the resistive element RE is a bipolar type as well as a unipolar type.

When the resistive element RE is the unipolar type, a resistance value of the resistive element RE may be controlled by magnitude of an applied voltage. When the resistive element RE is the bipolar type, the resistance value of the resistive element RE may be controlled by direction (i.e. polarity) of the applied voltage as well as magnitude of the applied voltage. The write operation may be performed by applying the voltages to the bit line BLj and the source line SLi, thereby controlling a voltage difference between both ends of the resistive element RE or controlling a current flowing through the resistive element RE.

Figure 10:
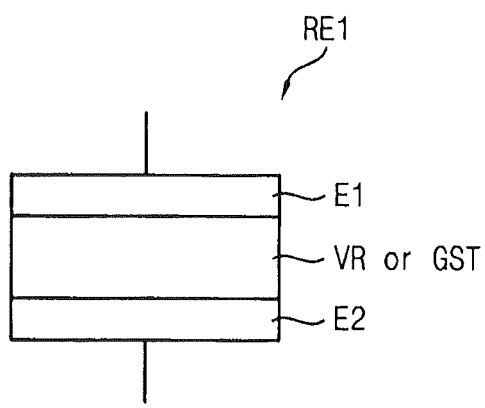
FIG. 10 a diagram illustrating an example of a unipolar resistive element in the resistive memory cell of FIG. 9.

FIG. 10 a diagram illustrating an example of a unipolar resistive element in the resistive memory cell of FIG. 9.

Referring to FIG. 10, a resistive element RE1 may include a first electrode E1, a second electrode E2 and resistive material between the electrodes E1 and E2. The electrodes E1 and E2 may be formed with metal such as tantalum (Ta), platinum (Pt), etc. The resistive material may include transition-metal oxide (VR) such as cobalt oxide, or phase change material such as GeSbTe (GST), etc. The phase change material may be in amorphous state or in crystalline state depending on heating time and/or heating temperature, and thus the phase change material may change its resistance according to phase change.

PRAM using phase change materials, RRAM using materials having variable resistance, and MRAM using ferromagnetism materials may be differentiated from each other, and those may be collectively referred to as resistive memories. Methods and devices using the selective floating of the source lines according to example embodiments of the inventive concepts may be applied to various resistive memories including PRAM, RRAM and MRAM.

Figure 11:
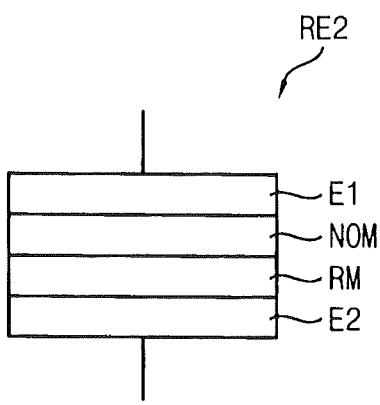
FIG. 11 a diagram illustrating an example of a bipolar resistive element in the resistive memory cell of FIG. 9.

FIG. 11 a diagram illustrating an example of a bipolar resistive element in the resistive memory cell of FIG. 9.

Referring to FIG. 11, a resistive element RE2 may include a first electrode E1, a second electrode E2, non-ohmic material (NOM) and resistive material (RM) between the electrodes E1 and E2. In this case, the on-state and the off-state may be programmed or written into memory cells by applying opposite voltages to the electrodes E1 and E2. In other words, the on-state and the off-state may be determined according to polarity of the applied voltage.

Figure 12:
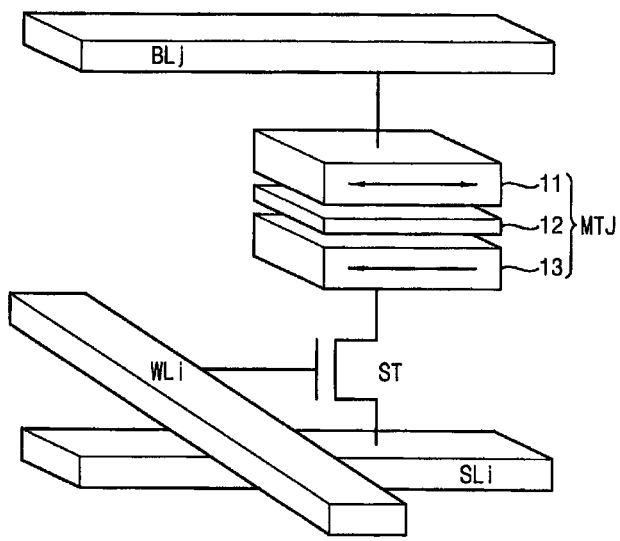
FIG. 12 is a diagram illustrating an example of a spin transfer torque magneto-resistive random access memory (STT-MRAM) cell included in a memory cell array in FIG. 1.

FIG. 12 is a diagram illustrating an example of a spin transfer torque magneto-resistive random access memory (STT-MRAM) cell included in a memory cell array in FIG. 1.

Referring to FIG. 12, the STT-MRAM cell may include a magnetic tunnel junction (MTJ) element and a cell transistor ST. A gate of the cell transistor ST is coupled to a corresponding word line WLi, a first electrode of the cell transistor ST is coupled to a corresponding bit line BLj via the MTJ element, and a second electrode of the cell transistor ST is coupled to a corresponding source line SLi.

The MTJ element may include a pinned layer 13, a free layer 11 and a barrier layer 12 between the two layers 11 and 13. The magnetization direction of the pinned layer 13 is fixed but the magnetization direction of the free layer 11 may be varied, according to the written data, between the same direction as or opposite direction to the magnetization direction of the pinned layer 13. In one example embodiment, an anti-ferromagnetic layer may be further included in the MTJ element to enforce the magnetization direction of the pinned layer 13.

For example, to perform the write operation of the STT-MRAM cell, a high level voltage is applied to the word line WLi to turn on the cell transistor ST, and a write current is applied to flow between the bit line BLj and the source line SLi.

For example, to perform the read operation of the STT-MRAM cell, a high level voltage is applied to the word line WLi to turn on the cell transistor ST, a read current is applied to flow from the bit line BLj to the source line SLi, and the resistance value is measured to determine the data stored in the MTJ element.

Figure 13:
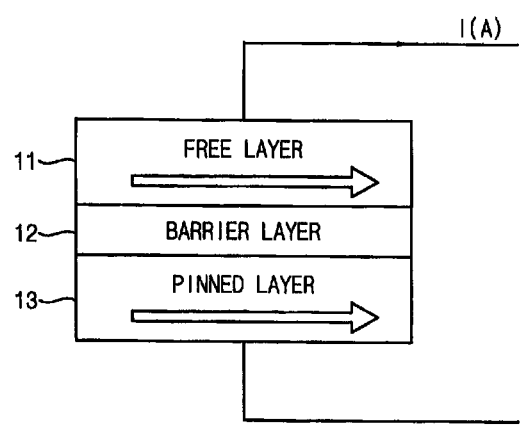
FIGS. 13 and 14 are diagrams illustrating magnetization directions of a magnetic tunnel junction (MTJ) element depending on written data.
Figure 14:
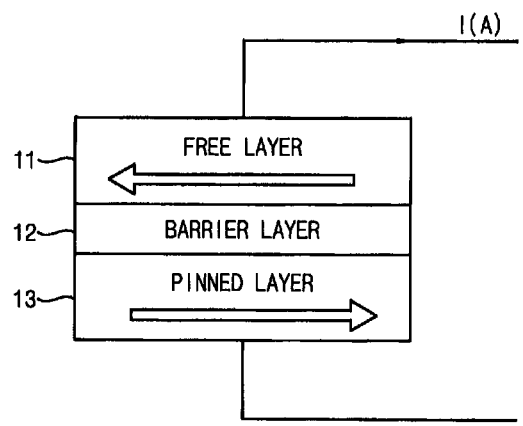

FIGS. 13 and 14 are diagrams illustrating magnetization directions of a magnetic tunnel junction (MTJ) element depending on written data.

The resistance value of the MTJ element may be changed according to the magnetization direction of the free layer 11. When the read current I(A) is applied to the MTJ element, the data voltage depending on the resistance value of the MTJ element is output. The magnitude of the read current I(A) is much smaller than the magnitude of a write current and thus the magnetization direction of the free layer is not changed due to the read current I(A).

Referring to FIG. 13, the magnetization direction of the free layer 11 may be arranged parallel with the magnetization direction of the pinned layer 13. In this case, the MTJ element has a relatively smaller resistance value and the data '0' may be read out by applying the read current I(A).

Referring to FIG. 14, the magnetization direction of the free layer 11 may be arranged opposite to the magnetization direction of the pinned layer 13. In this case, the MTJ element has a relatively greater resistance value and the data '1' may be read out by applying the read current I(A).

In such read operation, the reliability of the read data may be degraded due to the leakage current through the memory cells coupled to the unselected word lines and the unselected source lines. The leakage current may be reduce and thus the reliability of the read operation may be enhanced through the selective floating of the source lines according to example embodiments of the inventive concepts.

FIGS. 15 through 19 are diagrams illustrating examples of the MTJ element in the STT-MRAM cell.

Figure 15:
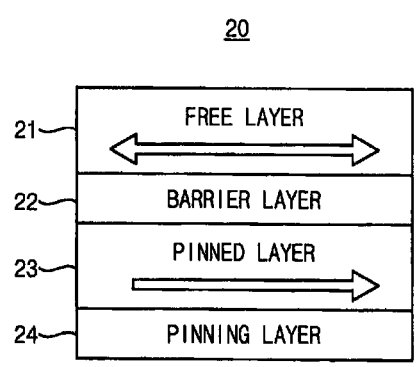
FIGS. 15 through 19 are diagrams illustrating examples of the MTJ element in the STT-MRAM cell.
Figure 16:
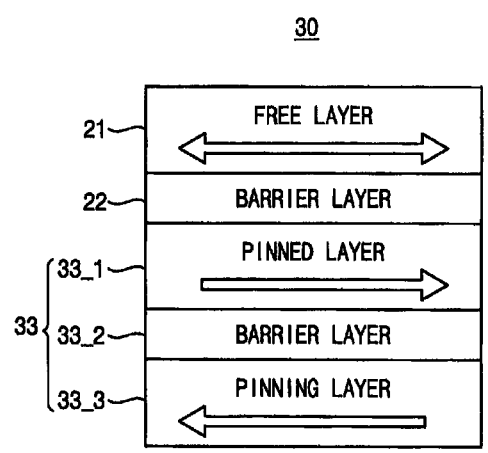

FIGS. 15 and 16 illustrate examples of the MTJ element having the horizontal magnetization, corresponding to a case that the direction of an applied current is perpendicular to the easy-magnetization axis.

Referring to FIG. 15, an MTJ element 20 may include a free layer 21, a barrier layer 22, a pinned layer 23 and a pinning layer 24.

The free layer 21 may include materials having a variable magnetization direction. The magnetization direction of the free layer 21 may be varied depending on internal and/or external electrical and/or magnetic factors. The free layer 21 may be implemented with ferromagnetic materials including at least one of cobalt (Co), iron (Fe) and nickel (Ni). For example, the free layer 21 may include at least one of FeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO and Y3Fe5O12.

The barrier layer 22 may have a width shorter than a spin diffusion distance. The barrier layer 22 may be implemented with non-magnetic materials. For example, the barrier layer 22 may include at least one of Mg, Ti, Al, an oxide of MgZn or MgB, and a nitride of Ti or V.

The pinned layer 23 may have the magnetization direction that is fixed by the pinning layer 24. The pinned layer 23 may be implemented with ferromagnetic materials. For example, the pinned layer 23 may include at least one of FeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO and Y3Fe5O12.

The pinning layer 24 may be implemented with anti-ferromagnetic materials. For example, the pinning layer 24 may include at least one of PtMn, IrMn, MnO, MnS, MnTe, MnF2, FeC12, FeO, CoC12, CoO, NiCl2, NiO and Cr.

When the free layer and the pinned layer are implemented with ferromagnetic materials, a stray field may be generated in edge portions of the ferromagnetic materials. The stray field may decrease magneto-resistance or increase the resistive magnetism in the free layer, thereby causing asymmetric switching. Thus the MTJ element may require structure for reducing or controlling the stray field due to the ferromagnetic materials.

Referring to FIG. 16, a fixed layer 33 in an MTJ element 30 may be implemented with synthetic anti-ferromagnetic (SAF). The fixed layer 33 may include a pinned layer 33_1, a barrier layer 33_2 and a pinning layer 33_3. Each of the pinned layer 33_1 and the pinning layer 33_3 may include at least one of CoFeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO and Y3Fe5O12. The magnetization directions of the pinned layer 33_1 and the pinning layer 33_3 may be different from each other and the magnetization directions of the pinned layer 33_1 and the pinning layer 33_3 may be fixed, respectively. The barrier layer 33_2 may include Ru.

Figure 17:
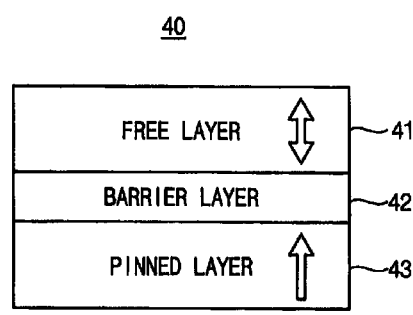

FIG. 17 illustrates an example of the MTJ element having the vertical magnetization, corresponds to a case that the direction of an applied current is parallel with the easy-magnetization axis.

Referring to FIG. 17, an MTJ element 40 includes a free layer 41, a barrier layer 42 and a pinned layer 43. The MTJ element 40 has a relatively smaller resistance when the magnetization direction of the free layer 41 is parallel with the magnetization direction of the pinned layer 43, and the MTJ element 40 has a relatively greater resistance when the magnetization direction of the free layer 41 is opposite to the magnetization direction of the pinned layer 43. The data may be stored as the resistance value.

For example, to implement the MTJ element 40 having the vertical magnetization, the free layer 41 and the pinned layer 43 may be implemented with materials having higher magnetic anisotropic energy such as alloys of amorphous rare-earth elements, multilayer thin films as $(Co/Pt)_n$ and $(Fe/Pt)_n$, superlattice materials of L10 crystalline structure. The free layer 41 may be an ordered alloy including at least one of Fe, Co, Ni, Pa and Pt. For example, the free layer 41 may include at least one of Fe—Pt alloy, Fe—Pd alloy, Co—Pd alloy, Co—Pt alloy, Fe—Ni—Pt alloy, Co—Fe—Pt alloy, and Co—Ni—Pt alloy. Such alloys may be, quantochemically, Fe50Pt50, Fe50Pd50, Co50Pd50, Co50Pt50, Fe30Ni20Pt50, Co30Fe20Pt50, or Co30Ni20Pt50.

The pinned layer 43 may be an ordered alloy including at least one of Fe, Co, Ni, Pa and Pt. For example, the pinned layer 43 may include at least one of Fe—Pt alloy, Fe—Pd alloy, Co—Pd alloy, Co—Pt alloy, Fe—Ni—Pt alloy, Co—Fe—Pt alloy, and Co—Ni—Pt alloy. Such alloys may be, quantochemically, Fe50Pt50, Fe50Pd50, Co50Pd50, Co50Pt50, Fe30Ni20Pt50, Co30Fe20Pt50, or Co30Ni20Pt50.

Figure 18:
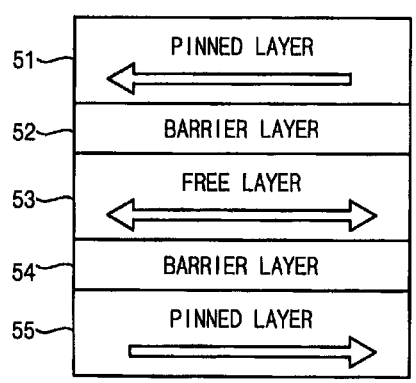
Figure 19:
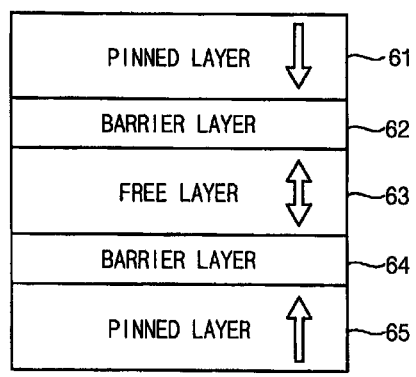

FIGS. 18 and 19 illustrate examples of a dual MTJ element having a structure that two pinned layers and two barrier layers are centered on a free layer.

Referring to FIG. 18, a dual MTJ element 50 forming horizontal magnetization may include a first barrier layer 51, a first barrier layer 52, a free layer 53, a second barrier layer 54 and a second pinned layer 55. The materials forming the respective layers may be the same as or similar to the materials of the free layer 21, the barrier layer 22 and the pinned layer 23 in FIG. 15.

In one example embodiment, when the magnetization direction of the first pinned layer 51 is fixed in the opposite direction to the magnetization direction of the second pinned layer 55, the magnetic fields due to the first and second pinned layers 51 and 55 may be interfered destructively. Accordingly, data may be written in the dual MTJ element 50 using the smaller write current than the single MTJ element. Also the exact data may be read from the dual MTJ element 50 because the MTJ element 50 provides the greater resistance value due to the second barrier layer 54.

Referring to FIG. 19, a dual MTJ element 60 forming vertical magnetization may include a first barrier layer 61, a first barrier layer 62, a free layer 63, a second barrier layer 64 and a second pinned layer 65. The materials forming the respective layers may be the same as or similar to the materials of the free layer 41, the barrier layer 42 and the pinned layer 43 in FIG. 15.

In one example embodiment, when the magnetization direction of the first pinned layer 61 is fixed in the opposite direction to the magnetization direction of the second pinned layer 65, the magnetic fields due to the first and second pinned layers 61 and 65 may be interfered destructively. Accordingly, data may be written in the dual MTJ element 60 using the smaller write current than the single MTJ element.

Figure 21:
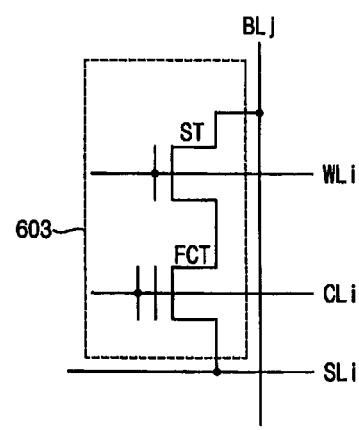
FIG. 21 is a diagram illustrating an example of a flash memory cell in the memory cell array of FIG. 20.

FIG. 20 is a diagram illustrating an example of a memory cell array in the memory device of FIG. 1, and FIG. 21 is a diagram illustrating an example of a flash memory cell in the memory cell array of FIG. 20.

As the memory cell array 100 in FIG. 1, a memory cell array 101 of may have a structure that each of the source lines is coupled to the memory cells of one row. Referring to FIG. 20, the memory cell array 101 includes a plurality of memory cells MCs arranged in a matrix form of a plurality of rows and columns. The memory cells MCs are coupled between a plurality of source lines SL1~SLm extended in a row direction X and a plurality of bit lines BL1~BLn extended in a column direction Y. The memory cells MCs are selected row by row by a plurality of word lines WL1~WLm extended in the row direction X. In addition, the memory cells MCs are coupled to a plurality of control lines CL1~CLm extended in the row direction X.

Referring to FIG. 21, a flash memory cell 603 may include a flash cell transistor FCT and a switching transistor ST. which are serially coupled between a corresponding bit line BLj and a corresponding source line SLi. A gate of the switching transistor ST is coupled to a corresponding word line WLi and a control gate of the flash cell transistor FCT is coupled to a corresponding control gate CLi. The voltages depending on the read operation, the write operation and the erase operation are applied to the control gate of the flash cell transistor FCT through the control line CLi. The switching transistor ST may be implemented with a low-voltage transistor having relatively a lower withstand voltage. In this case, the time for selecting the memory cell 603 may be reduced by applying relatively a lower voltage to the word line WLi and thus the performance of the memory device may be enhanced.

For example, the length of the gate of the switching transistor, that is, the length of the channel formed under the gate, may be increased to reduce the leakage current. In this case, however, the size of the memory cell array may be increased significantly because many memory cells are integrated in the memory cell array. Accordingly, the reliability of the read operation may be enhanced without increasing the size of the memory cell array, through the selective floating of the source lines according to example embodiments of the inventive concepts.

Figure 23:
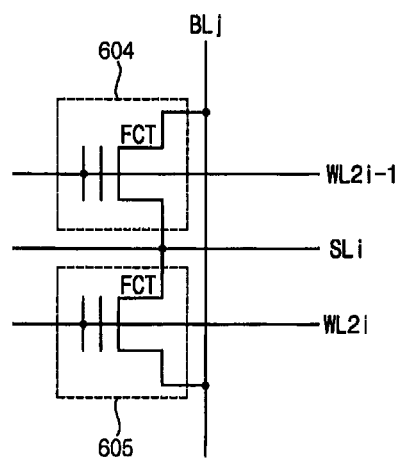
FIGS. 23 and 24 are diagrams illustrating examples of memory cells in the memory cell array of FIG. 22.
Figure 24:
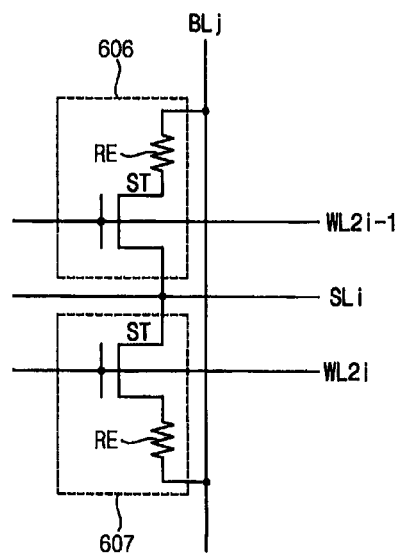

FIG. 22 is a diagram illustrating an example of a memory cell array in the memory device of FIG. 1, and FIGS. 23 and 24 are diagrams illustrating examples of memory cells in the memory cell array of FIG. 22.

Compared with the memory cells 101 of FIG. 20 in which each of the source lines is coupled to the memory cells of one row, a memory cell array 102 of FIG. 22 may have a structure that each of the source lines is coupled commonly to the memory cells of one even-numbered row and the memory cells of one odd-numbered row adjacent to the even-numbered row.

Referring to FIG. 22, the memory cell array 102 includes a plurality of memory cells MCs arranged in a matrix form of a plurality of rows and columns. The memory cells MCs are coupled between a plurality of source lines SL1~SLm extended in a row direction X and a plurality of bit lines BL1~BLn extended in a column direction Y. The memory cells MCs are selected row by row by a plurality of word lines WL1~WL2m extended in the row direction X.

Referring to FIG. 23, a first memory cell 604 corresponding to an odd-numbered row and a second memory cell 605 corresponding to an adjacent even-numbered row may be coupled commonly to one source line SLi. Each of the memory cells 604 and 605 may include a flash cell transistor FCT. The two flash cell transistors FCTs are coupled between a corresponding bit line BLj and the corresponding source line SLi. The control gates of the flash cell transistors FCTs are coupled to corresponding word lines WL2i-1 and WL2i, respectively.

Referring to FIG. 24, a first memory cell 606 corresponding to an odd-numbered row and a second memory cell 607 corresponding to an adjacent even-numbered row may be coupled commonly to one source line SLi. Each of the memory cells 606 and 607 may include a switching transistor ST and a resistive element RE. Each switching transistor ST and each resistive element RE are serially coupled between a corresponding bit line BLj and the corresponding source line SLi. The gates of the switching transistors STs are coupled to corresponding word lines WL2i-1 and WL2i, respectively.

As such, the memory cells corresponding the two adjacent rows may be coupled commonly to the one source line, and the integration degree of the memory device may be reduced by reducing the size of the peripheral circuits for controlling the operation of the memory cell array.

Figure 25:
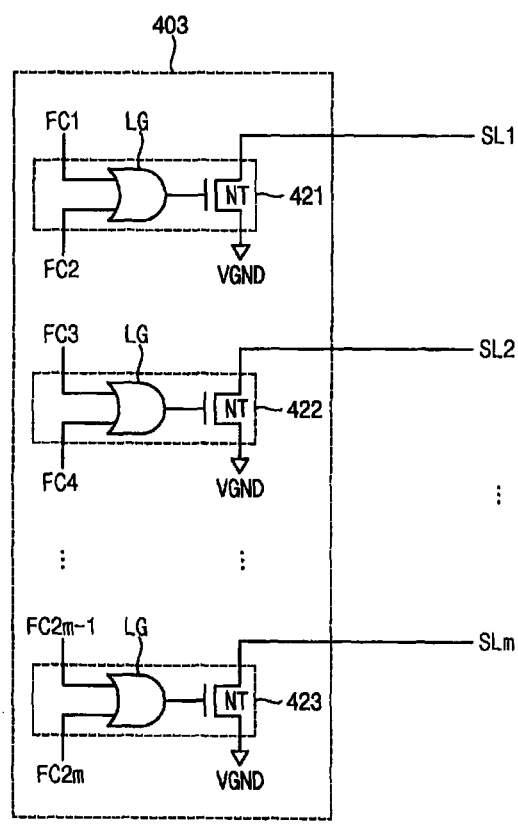
FIG. 25 is a diagram illustrating a source line floating circuit according to an example embodiment of the inventive concepts.

FIG. 25 is a diagram illustrating a source line floating circuit according to an example embodiment of the inventive concepts.

A source line floating circuit 403 may be applied to the memory cell array 102 of FIG. 22 in which each of the source lines is coupled commonly to the memory cells of one even-numbered row and the memory cells of one odd-numbered row adjacent to the even-numbered row.

Referring to FIG. 25, the source line floating circuit 403 may include a plurality of floating units 421, 422 and 423 corresponding to the number of the source lines SL1, SL2 and SLm. As described with reference to FIGS. 2 and 3, the floating units 421, 422 and 423 may directly receive the decoded row address signals DRA1~DRA2m or the word line voltages VWL1~VWL2m as the floating control signals FC1~FCm to control the electrical connections between the source lines SL1~SLm and the source voltage such as a ground voltage VGND.

Each of the floating units 421, 422 and 423 may include an OR gate LG and a switching element NT. The OR gate LG perform an OR logic operation on the two floating control signals FC2i-1 and FC2i (i=1, 2, ..., m) corresponding to the odd-numbered row and the even-numbered row. The switching element NT is coupled between the corresponding source line SLi and the source voltage VGND. The switching element NT performs a switching operation in response to an output of the OR gate LG. Accordingly the switching transistor NT is turned on when one of the odd-numbered word line WL2i-1 and the even-numbered word line WL2i so that the corresponding source line SL2i may be coupled to the source voltage VGND and the other source lines may be floated.

FIG. 26 is a diagram illustrating a source line driving circuit and a source line floating circuit according to an example embodiment of the inventive concepts.

A source line driving circuit 510 may be further included in the memory device, and, for example, the source line driving circuit 510 may be included in the voltage control circuit 500 in FIG. 1. The source line driving circuit 510 may include a plurality of source line driving units 511, 512 and 513 configured to apply a high voltage VSL to the source lines SL1, SL2 and SLm depending on operational modes. The source line floating circuit 404 may include a plurality of floating units (FU) 441, 442 and 443 configured to control selective floating of the source lines SL1, SL2 and SLm. As illustrated in FIG. 26, each of the floating units 441, 442 and 443 may be coupled between the source voltage VGND and each of the source line driving units 511, 512 and 513. The floating units 441, 442 and 443 may have a configuration similar to those as described with reference to FIGS. 2, 3 and 25.

Figure 27:
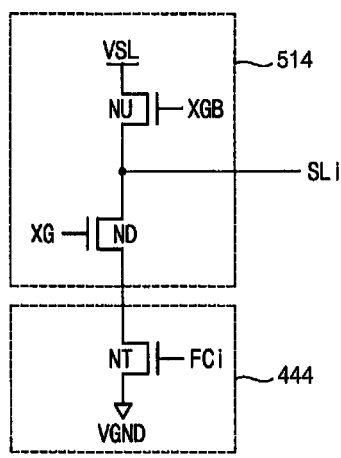
FIGS. 27 and 28 are circuit diagrams illustrating examples of a source line driving unit and a source line floating unit in the circuits of FIG. 26.
Figure 28:
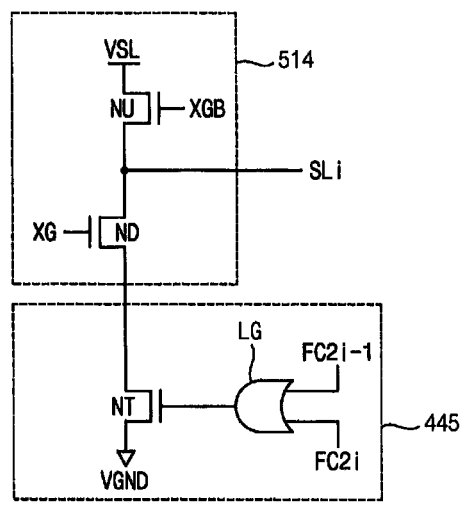

FIGS. 27 and 28 are circuit diagrams illustrating examples of a source line driving unit and a source line floating unit in the circuits of FIG. 26.

Referring to FIG. 27, each source line driving unit 514 may include a pull-up transistor NU and a pull-down transistor ND. The pull-down transistor ND is coupled between the source voltage VGN and the corresponding source line SLi, and a gate of the pull-down transistor ND receives a driving signal XG. The pull-up transistor NU is coupled between the high voltage VSL and the corresponding source line SLi, and a gate of the pull-up transistor NU receives an inversion signal XGB of the driving signal XG.

Each floating unit 444 may include a switch element NT that is coupled in series with the pull-down transistor ND between the corresponding source line SLi and the source voltage VGND. The floating unit 444 in FIG. 27 may be applied to the memory cell array in which each of the source lines is coupled to the memory cells of one row as described with reference to FIGS. 2 and 3. The switch element NT may be turned on in response to the floating control signal FCi corresponding to the one row.

The pull-up transistor NU and the pull-down transistor ND may be implemented with high-voltage transistors having relatively a higher withstand voltage, and the switching element NT may be implemented with a low-voltage transistor having relatively a lower withstand voltage. In this case, by implementing the switching element NT with the low-voltage transistor having a rapid switching speed, the reliability of the read operation may be enhanced without degrading the read speed due to the selective floating of the source lines.

The floating unit 445 in FIG. 28 may be applied to the memory cell array in which each of the source lines is coupled commonly to the memory cells of one even-numbered row and the memory cells of one odd-numbered row adjacent to the even-numbered row as described with reference to FIG. 22. The source line driving unit 514 is the same as the source line driving unit 513 described with reference to FIG. 27.

Each floating unit 445 may include an OR gate LG and a switch element NT. The OR gate LG performs an OR logic operation on the two floating control signals FC2i-1 and FC2i corresponding to the odd-numbered row and the adjacent even-numbered row. The switching element NT is coupled in series with the pull-down transistor ND between the corresponding source line SLi and the source voltage VGND. In other words, the switching element NT is coupled in series with the source line driving unit 514 between the high voltage VSL and the source voltage VGND. The switching element NT is turned on in response to an output of the OR gate LG.

Even though the OR gate LG receives the two control floating signals FC2i-1 and FC2i as inputs in FIG. 27, the OR gate LG may further receive other signals. For example, an erase enable signal may be further input to the OR gate LG so that the ground voltage VGND may be applied to the source lines in the erase operation.

As described with reference to FIG. 27, the pull-up transistor NU and the pull-down transistor ND may be implemented with high-voltage transistors having relatively a higher withstand voltage, and the switching element NT may be implemented with a low-voltage transistor having relatively a lower withstand voltage. Also the OR gate LG may be implemented with the low-voltage transistors. In this case, by implementing the floating unit 445 with the low-voltage transistors having a rapid operational speed, the reliability of the read operation may be enhanced without degrading the read speed due to the selective floating of the source lines.

FIG. 29 is a circuit diagram illustrating an example of a circuit for generating a driving signal provided to a source line driving circuit.

Referring to FIG. 29, a driving signal generation circuit 520 may include a first logic gate LG1, a second logic gate LG2, an inverter INV and an amplifier 521. The amplifier 521 may include PMOS transistors P1 and P2 and NMOS transistors N1 and N2 coupled between the power supply voltages VGG and VSS as illustrated in FIG. 29. The first logic gate LG1 may be a NOR gate that performs a NOR logic operation on a read enable signal RD and a test enable signal TS. The read enable signal RD may be activated in the logic high level in the read mode and the test enable signal TS may be activated in the logic high level in the test mode. The second logic gate LG2 may be an AND gate that performs an AND logic operation on the output of the first logic gate LG1 and a source line selection signal SLS. The output of the second logic gate LG1 and the inverted output by the inverter INV may be provided as inputs to the amplifier 521.

When the read enable signal RD is activated in the read operation, the output of the second logic gate LG2 may be in logic low level regardless of the other signals TS and SLS, the first NMOS transistor N1 is turned on and the second NMOS transistor N2 is turned off. Accordingly the driving signal XG has the high voltage level VGG and the inverted driving signal XGB has the low voltage level VSS.

Referring again to FIGS. 27 and 28, in response to the driving signal XG and the inverted driving signal XGB, the pull-up transistor NU is turned off and the pull-down transistor ND is turned on in the read operation to connect the source line SLi to the floating units 444 and 445. As described above, the floating units 444 and 445 may perform the selective floating of the source lines in response to the one floating control signal FCi or the two floating control signals FC2i-1 and FC2i.

Figure 31:
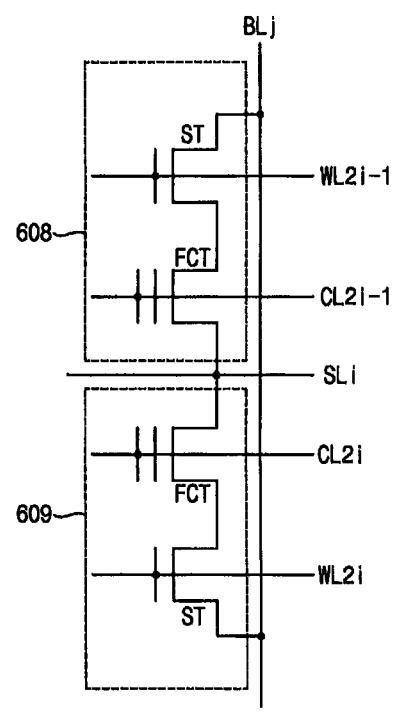
FIG. 31 is a diagram illustrating an example of flash memory cells in the memory cell array of FIG. 30.

FIG. 30 is a diagram illustrating an example of a memory cell array in the memory device of FIG. 1, and FIG. 31 is a diagram illustrating an example of flash memory cells in the memory cell array of FIG. 30.

As the memory cell array 102 of FIG. 22, a memory cell array 103 of FIG. 30 may have a structure that each of the source lines is coupled commonly to the memory cells of one even-numbered row and the memory cells of one odd-numbered row adjacent to the even-numbered row.

Referring to FIG. 30, the memory cell array 103 includes a plurality of memory cells MCs arranged in a matrix form of a plurality of rows and columns. The memory cells MCs are coupled between a plurality of source lines SL1~SLm extended in a row direction X and a plurality of bit lines BL1~BLn extended in a column direction Y. The memory cells MCs are selected row by row by a plurality of word lines WL1~WL2m extended in the row direction X. In addition, the memory cells MCs are coupled to a plurality of control lines CL1~CL2m extended in the row direction X.

Referring to FIG. 31, a first memory cell 608 corresponding to an odd-numbered row and a second memory cell 609 corresponding to an adjacent even-numbered row may be coupled commonly to one source line SLi. Each of the memory cells 608 and 609 may include a switching transistor ST and a flash cell transistor FCT. Each switching transistor ST and each flash cell transistor FCT are serially coupled between a corresponding bit line BLj and the corresponding source line SLi. The gates of the switching transistors STs are coupled to corresponding word lines WL2i-1 and WL2i, respectively. The control gates of the flash cell transistors FCTs are coupled to control lines CL2i-1 and CL2i, respectively. As described above, the various voltages may be applied to the control gates through the control lines CL2i-1 and CL2i for the read operation, the write operation, the erase operation, etc.

The switching transistor ST may be implemented with a low-voltage transistor having relatively a lower withstand voltage. In this case, the time for selecting the memory cell may be reduced by applying relatively a lower voltage to the word line WLi and thus the performance of the memory device may be enhanced. In addition, the size of the peripheral circuits for controlling the operation of the memory cell array may be reduced by coupling one source line to the memory cells corresponding to two adjacent rows.

FIG. 32 is a diagram for describing a read operation in a memory device according to an example embodiment of the inventive concepts.

FIG. 32 illustrates a configuration similar to those as described with reference to FIGS. 30 and 31. The memory cell array 104 be further coupled to a plurality of erase lines EL1 and EL2 for applying an erase voltage to erase gates. It is assumed that the memory cell coupled between the first word line WL1 and the second bit line BL2 is selected for reading the data therein.

In the read operation, the read voltage (e.g., 1.5 V) is applied in advance to all of the control lines CL1, CL2, CL3 and CL4. The second bit line BL2 corresponding to the column address CADD is precharged with the precharge voltage (e.g., 0.5V) and the unselected bit line BL1 maintains the discharged voltage level (e.g., 0V). The word line enable voltage (e.g., 1.1 V) is applied to the first word line corresponding to the row address RADD and the word line disable voltage (e.g., 0V) is applied to the unselected word lines WL2, WL3 and WL4. As such, relatively higher read voltage may be applied to the control gates of the flash cell transistors in advance and then relatively the lower word line enable voltage may be applied to the gate of the selected cell transistor having a rapid switching speed to increase the read speed.

In addition, using the above-described source line floating circuit, the selected source line SL1 is connected to the source voltage (e.g., 0 V) and the unselected source line SL2 may be floated to reduce the leakage current flowing through the unselected memory cells, thereby enhancing the reliability of the read operation.

Figure 33:
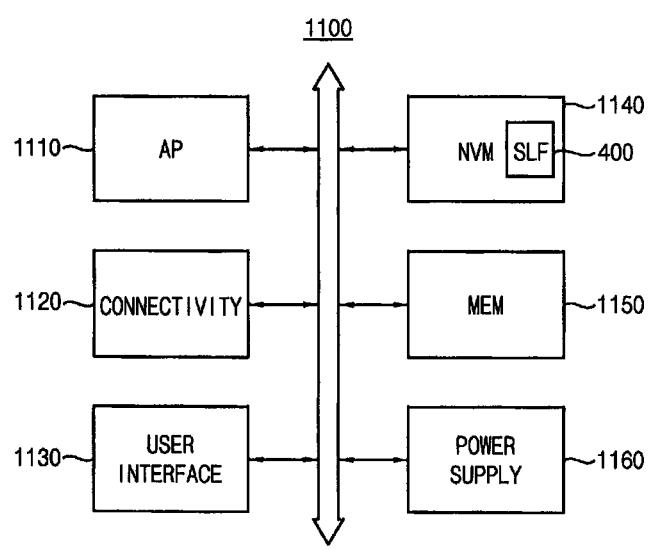
FIG. 33 is a block diagram illustrating a mobile system according to an example embodiment of the inventive concepts.

FIG. 33 is a block diagram illustrating a mobile system according to an example embodiment of the inventive concepts.

Referring to FIG. 33, a mobile system 1100 includes an application processor 1110, a connectivity unit 1120, a user interface 1130, a nonvolatile memory device 1140, a memory device 1150 and a power supply 1160. In some embodiments, the mobile system 1100 may be a mobile phone, a smart phone, a personal digital assistant (PDA), a portable multimedia player (PMP), a digital camera, a music player, a portable game console, a navigation system, etc.

The application processor 1110 may execute applications, such as a web browser, a game application, a video player, etc. In some embodiments, the application processor 1110 may include a single core or multiple cores. For example, the application processor 1110 may be a multi-core processor, such as a dual-core processor, a quad-core processor, a hexa-core processor, etc. The application processor 1110 may include an internal or external cache memory.

The connectivity unit 1120 may perform wired or wireless communication with an external device. For example, the connectivity unit 1120 may perform Ethernet communication, near field communication (NFC), radio frequency identification (RFID) communication, mobile telecommunication, memory card communication, universal serial bus (USB) communication, etc. In some embodiments, the connectivity unit 1120 may include a baseband chipset that supports communications, such as global system for mobile communications (GSM), general packet radio service (GPRS), wideband code division multiple access (WCDMA), high speed downlink/uplink packet access (HSxPA), etc.

The memory device 1150 may store data processed by the application processor 1110 or may operate as a working memory. For example, the memory device 1150 may be a dynamic random access memory, such as DDR SDRAM, LPDDR SDRAM, GDDR SDRAM, RDRAM, etc., or may be any volatile memory device.

The nonvolatile memory device 1140 may include a source line floating circuit (SLF) 400 according to example embodiments of the inventive concepts as described above. The nonvolatile memory device 1140 may store a boot code for booting the mobile system 1100. For example, the nonvolatile memory device 1140 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 1130 may include at least one input device, such as a keypad, a touch screen, etc., and at least one output device, such as a speaker, a display device, etc. The power supply 1160 may supply a power supply voltage to the mobile system 1100. In some embodiments, the mobile system 1100 may further include a camera image processor (CIS), and/or a storage device, such as a memory card, a solid state drive (SSD), a hard disk drive (HDD), a CD-ROM, etc.

In some embodiments, the mobile system 1100 and/or components of the mobile system 1100 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 34:
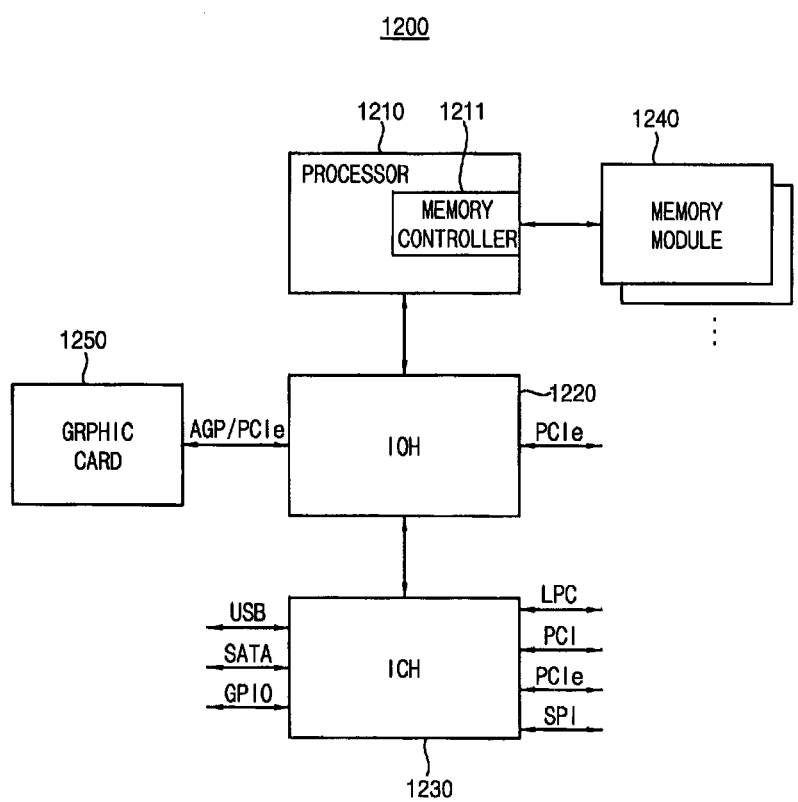
FIGS. 34 and 35 are block diagrams illustrating a computing system according to an example embodiment of the inventive concepts.
Figure 35:
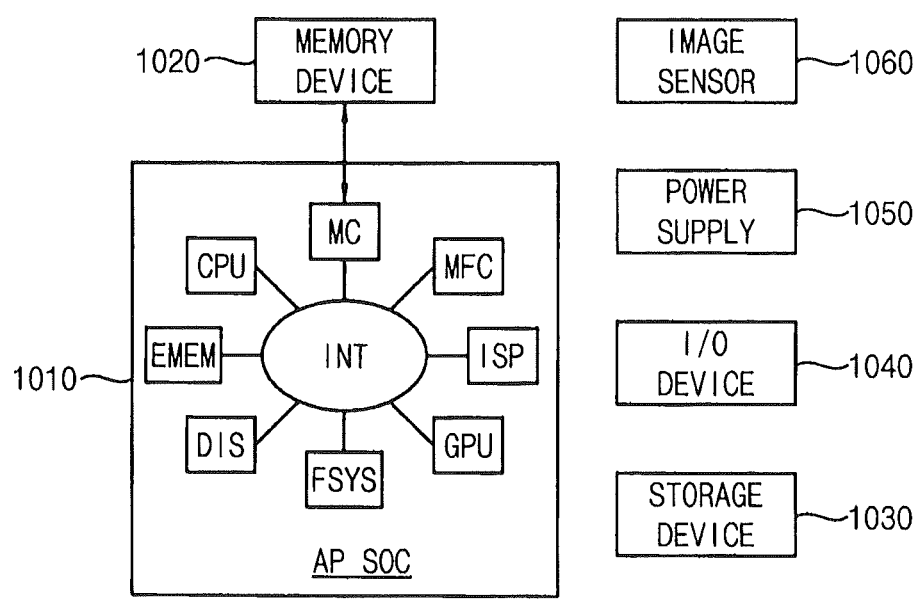

FIGS. 34 and 35 are block diagrams illustrating a computing system according to an example embodiment of the inventive concepts.

Referring to FIG. 34, a computing system 1200 includes a processor 1210, an input/output hub (IOH) 1220, an input/output controller hub (ICH) 1230, at least one memory module 1240, and a graphics card 1250. In some embodiments, the computing system 1200 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 1210 may perform various computing functions, such as executing specific software for performing specific calculations or tasks. For example, the processor 1210 may be a microprocessor, a central process unit (CPU), a digital signal processor, or the like. In some embodiments, the processor 1210 may include a single core or multiple cores. For example, the processor 1210 may be a multi-core processor, such as a dual-core processor, a quad-core processor, a hexa-core processor, etc. Although FIG. 17 illustrates the computing system 1200 including one processor 1210, in some embodiments, the computing system 1200 may include a plurality of processors. The processor 1210 may include an internal or external cache memory.

The processor 1210 may include a memory controller 1211 for controlling operations of the memory module 1240. The memory controller 1211 included in the processor 1210 may be referred to as an integrated memory controller (IMC). A memory interface between the memory controller 1211 and the memory module 1240 may be implemented with a single channel including a plurality of signal lines, or may be implemented with multiple channels, to each of which at least one memory module 1240 may be coupled. In some embodiments, the memory controller 1211 may be located inside the input/output hub 1220, which may be referred to as memory controller hub (MCH).

The memory module 1240 may include a plurality of memory devices that store data provided from the memory controller 1211. At least one source line floating circuit according to example embodiments may be included in each memory module and/or in the embedded memory in the processor 1210.

The input/output hub 1220 may manage data transfer between processor 1210 and devices, such as the graphics card 1250. The input/output hub 1220 may be coupled to the processor 1210 via various interfaces. For example, the interface between the processor 1210 and the input/output hub 1220 may be a front side bus (FSB), a system bus, a HyperTransport, a lightning data transport (LDT), a QuickPath interconnect (QPI), a common system interface (CSI), etc. Although FIG. 34 illustrates the computing system 1200 including one input/output hub 1220, in some embodiments, the computing system 1200 may include a plurality of input/output hubs.

The input/output hub 1220 may provide various interfaces with the devices. For example, the input/output hub 1220 may provide an accelerated graphics port (AGP) interface, a peripheral component interface-express (PCIe), a communications streaming architecture (CSA) interface, etc.

The graphics card 1250 may be coupled to the input/output hub 1220 via AGP or PCIe. The graphics card 1250 may control a display device (not shown) for displaying an image. The graphics card 1250 may include an internal processor for processing image data and an internal memory device. In some embodiments, the input/output hub 1220 may include an internal graphics device along with or instead of the graphics card 1250 outside the graphics card 1250. The graphics device included in the input/output hub 1220 may be referred to as integrated graphics. Further, the input/output hub 1220 including the internal memory controller and the internal graphics device may be referred to as a graphics and memory controller hub (GMCH).

The input/output controller hub 1230 may perform data buffering and interface arbitration to efficiently operate various system interfaces. The input/output controller hub 1230 may be coupled to the input/output hub 1220 via an internal bus, such as a direct media interface (DMI), a hub interface, an enterprise Southbridge interface (ESI), PCIe, etc. The input/output controller hub 1230 may provide various interfaces with peripheral devices. For example, the input/output controller hub 1230 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1210, the input/output hub 1220 and the input/output controller hub 1230 may be implemented as separate chipsets or separate integrated circuits. In other embodiments, at least two of the processor 1210, the input/output hub 1220 and the input/output controller hub 1230 may be implemented as a single chipset.

Referring to FIG. 35, a computing system 2000 includes a system on chip (SOC) 1010, a memory device 1020, a storage device 1030, an input/output (I/O) device 1040, a power supply 1050 and an image sensor 1060. Although not illustrated in FIG. 35, the computing system 2000 may further include ports that communicate with a video card, a sound card, a memory card, a USB device, or other electronic devices.

The SOC 1010 may be an application processor (AP) SOC including an interconnect device INT and a plurality of intellectual properties coupled to the interconnect device. As illustrated in FIG. 35, the intellectual properties may include a memory controller MC, a central processing unit CPU, a display controller DIS, a file system block FSYS, a graphic processing unit GPU, an image signal processor ISP, a multiformat codec block MFC, etc.

The SOC 1010 may communicate with the memory device 1020, the storage device 1030, the input/output device 1040 and the image sensor 1060 via a bus such as an address bus, a control bus, and/or a data bus. In at least one exemplary embodiment, the SOC 1010 is coupled to an extended bus, such as a peripheral component interconnection (PCI) bus.

The memory device 1020 may store data for operating the computing system 2000. For example, the memory device 1020 may be implemented with a dynamic random access memory (DRAM) device, a mobile DRAM device, a static random access memory (SRAM) device, a phase random access memory (PRAM) device, a ferroelectric random access memory (FRAM) device, a resistive random access memory (RRAM) device, and/or a magnetic random access memory (MRAM) device. The storage device 1030 may include a solid state drive (SSD), a hard disk drive (HDD), a CD-ROM, etc. The input/output device 1040 may include an input device (e.g., a keyboard, a keypad, a mouse, etc.) and an output device (e.g., a printer, a display device, etc.). The power supply 1050 supplies operation voltages for the computing system 2000.

The image sensor 1060 may communicate with the SOC 1010 via the buses or other communication links. As described above, the image sensor 1060 may be integrated with the SOC 1010 in one chip, or the image sensor 1060 and the SOC 1010 may be implemented as separate chips.

The computing system 2000 may be any computing system including at least one SOC. For example, the computing system 2000 may include a digital camera, a mobile phone, a smart phone, a portable multimedia player (PMP), a personal digital assistant (PDA), a tablet computer, etc.

The source line floating circuit according to example embodiments may be included in the embedded memory EMEM and/or the memory device 1020 to reduce the leakage current and enhance the reliability of the read operation.

The present inventive concepts may be applied to any memory device and particularly to a nonvolatile memory device such as flash memory, MRAM, PRAM, RRAM, etc. The present inventive concepts may be applied to memory devices and systems that operate under high-temperature environments and thus the leakage current is serious. For example, the present inventive concepts may be usefully applied to a mobile phone, a smart phone, a personal digital assistant (PDA), a portable multimedia player (PMP), a digital camera, a camcorder, a personal computer, a server computer, a workstation, a notebook computer, a digital TV, a set-top box, a music player, a portable game console, a navigation system, a smart card, a printer, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A memory device comprising:
   a memory cell array including a plurality of memory cells arranged in a matrix form of a plurality of rows and columns, the memory cells coupled between a plurality of source lines extended in a row direction and a plurality of bit lines extended in a column direction, the memory cells configured to be selected row by row by a plurality of word lines extended in the row direction;
   a row selection circuit configured to generate a plurality of decoded row address signals that are activated selectively in response to a row address signal, and configured to enable one selected word line among the word lines in response to the decoded row address signals; and
   a source line floating circuit configured to, in a read operation, connect one selected source line of the source lines to a source voltage and configured to disconnect unselected source lines except the one selected source line from the source voltage to float the unselected source lines, the one selected source line coupled to the memory cells that are coupled to the one selected word line, wherein the source line floating circuit includes a plurality of floating units that receive the decoded row address signals or voltages of the word lines as floating control signals, respectively, the floating units configured to control electrical connections between the source lines and the source voltage in response to the floating control signals.

2. The memory device of claim 1, wherein each of the source lines is coupled to the memory cells of one row.

3. The memory device of claim 2, wherein each of the floating units includes:
   a switching element coupled between the corresponding source line and the source voltage, the switching element configured to perform a switching operation in response to the floating control signal corresponding to the one row.

4. The memory device of claim 1, wherein each of the source lines is coupled commonly to the memory cells of one even-numbered row and the memory cells of one odd-numbered row adjacent to the even-numbered row.

5. The memory device of claim 4, wherein each of the floating units includes:
   an OR gate configured to perform an OR logic operation on the two floating control signals corresponding to the even-numbered row and the odd-numbered row; and
   a switching element coupled between the corresponding source line and the source voltage, the switching element configured to perform a switching operation in response to an output of the OR gate.

6. The memory device of claim 1, further comprising:
   a plurality of source line driving units configured to apply a high voltage to the source lines depending on operational modes, each of the source line driving units comprising:
   a pull-down transistor coupled between the source voltage and the corresponding source line, a gate of the pull-down transistor receiving a driving signal; and
   a pull-up transistor coupled between the high voltage and the corresponding source line, a gate of the pull-up transistor receiving an inverted driving signal.

7. The memory device of claim 6, wherein each of the floating units includes:
   a switching element coupled in series with the pull-down transistor between the corresponding source line and the source voltage.

8. The memory device of claim 7, wherein the pull-up transistor and the pull-down transistor are implemented with high-voltage transistors, and the switching element is implemented with a low-voltage transistor having a lower withstand voltage than the high-voltage transistors.

9. The memory device of claim 7, wherein each of the source lines is coupled to the memory cells of one row, and
   wherein the switching element comprises a low-voltage transistor that is turned on in response to the floating control signal corresponding to the one row.

10. The memory device of claim 7, wherein each of the source lines is coupled commonly to the memory cells of one even-numbered row and the memory cells of one odd-numbered row adjacent to the even-numbered row,
    wherein each of the floating units further includes an OR gate configured to perform an OR logic operation on the two floating control signals corresponding to the even-numbered row and the odd-numbered row, and
    wherein the switching element comprises a low-voltage transistor that is turned on in response to an output of the OR gate.

11. The memory device of claim 1, wherein each of the memory cells includes:
    a flash cell transistor coupled between the corresponding bit line and the corresponding source line, a control gate of the flash cell transistor coupled to the corresponding word line.

12. The memory device of claim 1, wherein each of the memory cells includes:
    a switching transistor coupled between the corresponding bit line and the corresponding source line, a gate of the switching transistor coupled to the corresponding word line; and
    a flash cell transistor coupled in series with the switching transistor between the corresponding bit line and the corresponding source line, a control gate of the flash cell transistor coupled to a corresponding control line of a plurality of control lines.

13. The memory device of claim 12, wherein, in the read operation, a read voltage is applied to all of the control lines, a word line enable voltage is applied to the one selected word line and a word line disable voltage is applied to the unselected word lines, the word line enable voltage being lower than the read voltage, the word line disable voltage being lower than the word line enable voltage.

14. The memory device of claim 1, wherein each of the memory cells includes:
    a switching transistor coupled between the corresponding bit line and the corresponding source line, a gate of the switching transistor coupled to the corresponding word line; and
    a resistive element coupled in series with the switching transistor between the corresponding bit line and the corresponding source line.

15. The memory device of claim 14, wherein the memory cell array includes phase change random access memory (PRMA) cells, resistance random access memory (RRAM) cells, magneto-resistive random access memory (MRAM) cells, or spin transfer torque magneto-resistive random access memory (STT-MRAM) cells.

16. The memory device of claim 1, wherein the memory device is an embedded non-volatile memory device that is integrated with at least one processor in a single chip.

17. A method of reading data in a memory device including a memory cell array in which a plurality of memory cells are arranged in a matrix form of a plurality of rows and columns, the memory cells coupled between a plurality of source lines extended in a row direction and a plurality of bit lines extended in a column direction, the memory cells configured to be selected row by row by a plurality of word lines extended in the row direction, the method comprising:
    generating a plurality of decoded row address signals that are activated selectively in response to a row address signal;
    enabling one selected word line among the word lines in response to the decoded row address signals;
    receiving the decoded row address signals or voltages of the word lines as floating control signals; and
    in response to the floating control signals in a read operation, connecting one selected source line of the source lines to a source voltage and disconnecting unselected source lines except the one selected source line from the source voltage to float the unselected source lines, the one selected source line coupled to the memory cells that are coupled to the one selected word line.

18. The method of claim 17, wherein each of the source lines is coupled to the memory cells of one row, and each of the source lines is floated in response to one floating control signal of the floating control signals in the read operation.

19. The method of claim 17, wherein each of the source lines is coupled commonly to the memory cells of one even-numbered row and the memory cells of one odd-numbered row adjacent to the even-numbered row, and each of the source lines is floated in response to two floating control signals of the floating control signals in the read operation.

20. The method of claim 17, further comprising:
applying a high voltage to the source lines depending on operational modes, using a plurality of source line driving units coupled between the high voltage and the source voltage,
wherein each of the source line driving units is connected to or disconnected from the source voltage in response to the corresponding floating control signal.

21. The method of claim 17, wherein the memory device is a non-volatile memory device including flash memory cells, phase change random access memory (PRMA) cells, resistance random access memory (RRAM) cells or magneto-resistive random access memory (MRAM) cells.

22. A source line floating circuit in a memory device including a memory cell array in which a plurality of memory cells are arranged in a matrix form of a plurality of rows and columns, the memory cells coupled between a plurality of source lines extended in a row direction and a plurality of bit lines extended in a column direction, the memory cells configured to be selected row by row by a plurality of word lines extended in the row direction, the source line floating circuit comprising:
a plurality of floating units that receive decoded row address signals or voltages of the word lines as floating control signals, respectively, the decoded row address signals being activated selectively in response to a row address signal, the floating units configured to control electrical connections between the source lines and the source voltage in response to the floating control signals in a read operation.

23. The source line floating circuit of claim 22, wherein each of the floating units is coupled directly between the source voltage and the corresponding source line.

24. The source line floating circuit of claim 22, wherein each of the floating units is coupled directly between the source voltage and a source line driving unit configured to drive the corresponding source line.

25. A memory device comprising:
a memory cell array including a plurality of memory cells arranged in a matrix form of a plurality of rows and columns, the memory cells coupled between a plurality of source lines extended in a row direction and a plurality of bit lines extended in a column direction, the rows of memory cells configured to be selected by a plurality of word lines extended in the row direction;
a row selection circuit configured to generate a plurality of decoded row address signals that are activated selectively in response to a row address signal, and further configured to enable a selected word line among the word lines in response to the decoded row address signals; and
a source line floating circuit that is also responsive to the decoded row address signals and is configured to connect a selected source line of the source lines that corresponds to the selected word line among the word lines to a source voltage and is further configured to float unselected source lines.

26. The memory device of claim 25, wherein the source line floating circuit includes a plurality of floating units that are configured to receive the decoded row address signals as floating control signals, the floating units configured to control electrical connections between the source lines and the source voltage in response to the floating control signals.

27. The memory device of claim 26, further comprising:
a plurality of source line driving units, a respective one of the source line driving units comprising:
a pull-down transistor coupled between the source voltage and the corresponding source line, a gate of the pull-down transistor configured to receive a driving signal; and
a pull-up transistor coupled between a reference voltage and the corresponding source line, a gate of the pull-up transistor configured to receive an inverted driving signal.

28. The memory device of claim 27, wherein a respective one of the floating units comprises:
a switching element coupled in series with the pull-down transistor between the corresponding source line and the source voltage;
wherein the pull-up transistor and the pull-down transistor are implemented with a high-voltage transistor, and the switching element is implemented with a low-voltage transistor having a lower withstand voltage than the high-voltage transistor.

* * * * *